United States Patent
Akizuki et al.

(10) Patent No.: US 9,287,828 B2
(45) Date of Patent: Mar. 15, 2016

(54) MIXING CIRCUIT

(71) Applicant: Panasonic Intellectual Property Management Co., Ltd., Osaka City (JP)

(72) Inventors: Taiji Akizuki, Miyagi (JP); Junji Sato, Tokyo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/398,772

(22) PCT Filed: Feb. 26, 2014

(86) PCT No.: PCT/JP2014/001034
§ 371 (c)(1),
(2) Date: Nov. 4, 2014

(87) PCT Pub. No.: WO2014/136402
PCT Pub. Date: Sep. 12, 2014

(65) Prior Publication Data
US 2015/0137869 A1 May 21, 2015

(30) Foreign Application Priority Data
Mar. 5, 2013 (JP) .................................. 2013-043495

(51) Int. Cl.
*H03D 7/14* (2006.01)
(52) U.S. Cl.
CPC ........... *H03D 7/1441* (2013.01); *H03D 7/1458* (2013.01); *H03D 7/1491* (2013.01); *H03D 2200/0023* (2013.01); *H03D 2200/0066* (2013.01); *H03D 2200/0088* (2013.01)

(58) Field of Classification Search
CPC .. H03D 7/1441; H03D 7/1458; H03D 7/1491
USPC ........... 327/355, 356, 359; 375/316; 455/205, 455/313, 323, 333, 337
See application file for complete search history.

(56) References Cited

U.S. PATENT DOCUMENTS

| | | | |
|---|---|---|---|
| 5,499,056 A * | 3/1996 | Pugel ...................... | H03J 5/244 334/11 |
| 2003/0114129 A1 * | 6/2003 | Jerng ........................ | H04B 1/18 455/323 |
| 2005/0164669 A1 * | 7/2005 | Molnar ................ | H03D 7/1441 455/320 |
| 2011/0110463 A1 | 5/2011 | Chang et al. | |

FOREIGN PATENT DOCUMENTS

| JP | 11-261342 A | 9/1999 |
|---|---|---|
| JP | 2001-223535 A | 8/2001 |
| JP | 2005-057629 A | 3/2005 |
| JP | 2012-527119 A | 11/2012 |

OTHER PUBLICATIONS

International Search Report for Application No. PCT/JP2014/001034 dated Apr. 8, 2014.

* cited by examiner

*Primary Examiner* — William Hernandez
(74) *Attorney, Agent, or Firm* — Pearne & Gordon LLP

(57) ABSTRACT

A balun converts a single-ended radio-frequency signal into differential signals. A differential matching circuit outputs a maximum-level positive-phase output signal at a lower or higher frequency than the center frequency and outputs a maximum-level reverse-phase output signal at a higher or lower frequency than the center frequency. An amplification circuit amplifies a positive-phase output signal and a reverse-phase output signal of the differential matching circuit. A mixing circuit converts the positive-phase output signal and the reverse-phase output signal that are output from the amplification circuit into intermediate-frequency signals using locally generated signals.

9 Claims, 14 Drawing Sheets

MIXING CIRCUIT

TECHNICAL FIELD

The present disclosure relates to a mixing circuit for converting a radio-frequency signal into a low-frequency signal.

BACKGROUND ART

In recent years, the bandwidths of modulation signals have increased in radio-frequency communications standards for high-speed transmission, which means that the characteristic of modulation accuracy tends to degrade because of increase in the frequency deviation of a radio communication circuit for one communication channel. Therefore, when a mixing circuit for converting a radio-frequency signal into, for example, an intermediate-frequency (IF) signal is used in a wide band, it is important to decrease the frequency deviation of its conversion gain.

In the following description, the ratio of the amplitude of differential IF signals that are output from a mixing circuit to that of a radio-frequency signal that is input to the mixing circuit will be referred to as a conversion gain.

For example, a mixing circuit shown in FIG. 12 (refer to Patent document 1, for example) is known as a prior art technique for decreasing the frequency deviation of a conversion gain. FIG. 12 shows the circuit configuration of a conventional mixing circuit 10. The mixing circuit 10 shown in FIG. 12 includes a single-ended matching circuit MA11, an amplification circuit AP11, a differential matching circuit MA12 which includes a balun DR11, and a mixing circuit MX11.

In the mixing circuit 10 shown in FIG. 12, a single-ended radio-frequency signal that is input to an input terminal RFIN is subjected to impedance matching in the single-ended matching circuit MA11 and then amplified by a transistor M11 of the amplification circuit AP11. The single-ended radio-frequency signal as amplified by the amplification circuit AP11 is converted into differential radio-frequency signals by the balun DR11. Of the differential signals, a positive-phase (positive) output signal is subjected to matching in an inductor L11 and a resistor R11 and a negative-phase (negative) output signal is subjected to matching in an inductor L12 and a resistor R12, whereby maximum-level differential signals are input to the mixing circuit MX11.

The differential signals that are output from the differential matching circuit MA12 are down-converted by the mixing circuit MX11 being mixed with local signals that are input via a positive input terminal Lop and a negative input terminal Lon, respectively. Of the differential IF signals generated through the down conversion, a positive-phase IF signal is output from a positive output terminal IFp and a reverse-phase IF signal is output from a negative output terminal IFn.

However, inductors and capacitors (e.g., inductors L11 and L12 and capacitor C11) used as the matching elements of the single-ended matching circuit MA11 and the differential matching circuit MA12 of the mixing circuit 10 shown in FIG. 12 have large frequency deviations, which is a factor in causing a large frequency deviation of the conversion gain of the mixing circuit 10. In view of this, in the mixing circuit 10, the resistors R11 and R12 are added so as to be series-connected to the inductors L11 and L12 of the differential matching circuit MA12, respectively. As a result, the Q value of the differential matching circuit MA12 is decreased and the frequency deviation of the conversion gain of the mixing circuit 10 is decreased.

PRIOR ART DOCUMENTS

Patent Documents

Patent document 1: JP-A-2005-57629

SUMMARY OF THE INVENTION

Problems to be Solved by the Invention

However, the mixing circuit 10 of Patent document 1 (see FIG. 12) suffers loss of a radio-frequency signal because the resistors R11 and R12 are added so as to be series-connected to the respective output ends of the differential matching circuit MA12 to decrease the frequency deviation of the conversion gain. This results in a problem of lowering of the conversion gain of the mixing circuit 10, which in turn restricts the operation frequency bandwidth of the mixing circuit 10.

The present disclosure has been made to solve the above problems of the prior art, and an object of the disclosure is therefore to provide a mixing circuit which is decreased in the frequency deviation of the conversion gain of conversion of an input radio-frequency signal into an IF signal and operates in a wide band.

Means for Solving the Problems

The disclosure provides a mixing circuit comprising a balun for converting a single-ended radio-frequency signal into differential signals; a differential matching circuit that outputs a maximum-level positive-phase output signal of the balun at a frequency lower than or higher than a center frequency of the radio-frequency signal and that outputs a maximum-level reverse-phase output signal at a frequency higher that or lower than the center frequency of the radio-frequency signal; an amplification circuit that amplifies an in-phase output signal and a reverse-phase output signal of the differential matching circuit; and a mixing circuit that converts the positive-phase output signal and the reverse-phase output signal of the amplification circuit into intermediate-frequency signals using locally generated signals.

The disclosure also provides a mixing circuit comprising a single-ended matching circuit that outputs a maximum-level single-ended radio-frequency signal at a center frequency of the radio-frequency signal; a balun that converts the output single-ended signal of the single-ended matching circuit into differential signals; a differential matching circuit that outputs a maximum-level positive-phase output signal of the balun at a frequency lower that or higher than the center frequency of the radio-frequency signal and outputs a maximum-level reverse-phase output signal at a frequency higher that or lower than the center frequency of the radio-frequency signal; an amplification circuit that amplifies a positive-phase output signal and a reverse-phase output signal of the differential matching circuit; and a mixing circuit that converts the positive-phase output signal and the reverse-phase output signal of the amplification circuit into intermediate-frequency signals using locally generated signals, wherein the single-ended matching circuit comprises plural series connections of a capacitor and a switch which are provided between a signal path of the single-ended radio-frequency signal and a ground.

Advantages of the Invention

The disclosure decreases the frequency deviation of the conversion gain of conversion of an input radio-frequency signal into an IF signal and enables operation in a wide band.

MODES FOR CARRYING OUT THE INVENTION

Background of Embodiments

Figure 13:
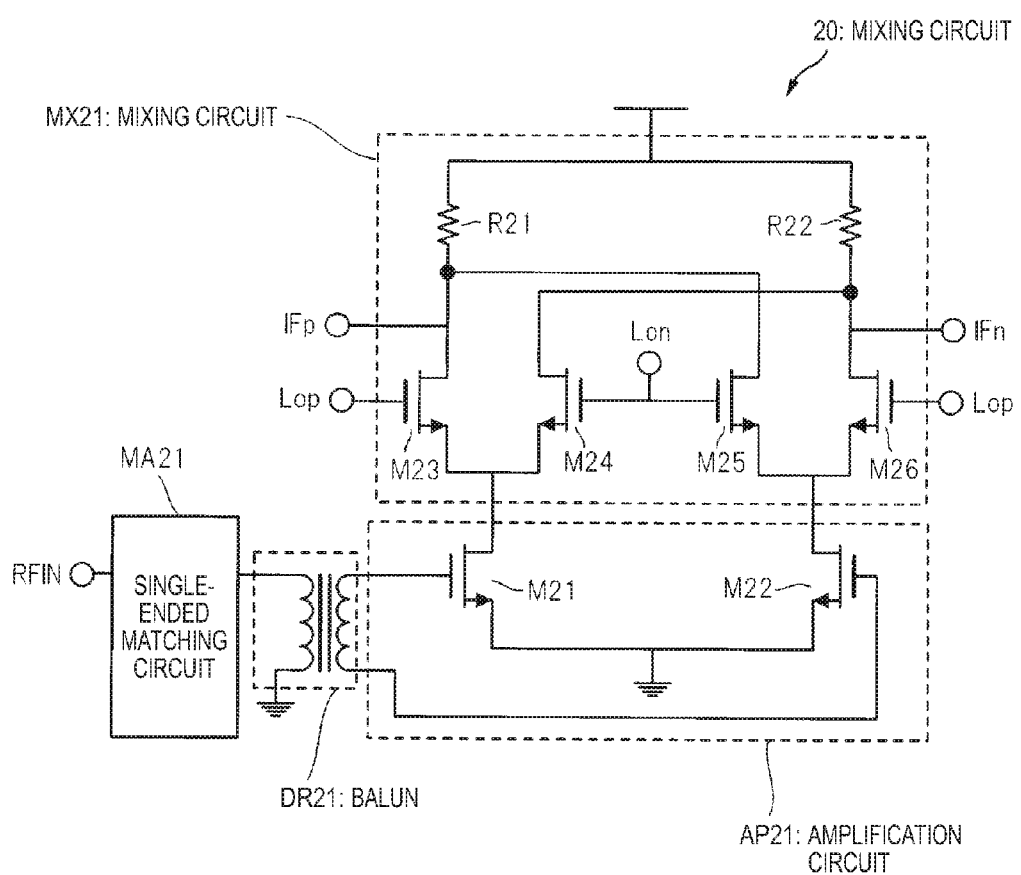
FIG. 13 shows the circuit configuration of a conventional double-balanced mixing circuit.

First, before the description of mixing circuits according to embodiments of the present disclosure, the background of the embodiments will be described with reference to FIG. 13. FIG. 13 shows the circuit configuration of a conventional double-balanced mixing circuit 20.

The mixing circuit 20 shown in FIG. 13 includes a single-ended matching circuit MA21, a balun DR21, an amplification circuit AP21, and a mixing circuit MX21.

In the mixing circuit 20 shown in FIG. 13, a single-ended radio-frequency signal that is input to an input terminal RFIN is subjected to impedance matching in the single-ended matching circuit MA21 and output to the balun DR21.

The balun DR21 converts the received single-ended radio-frequency signal into differential signals and thereby outputs positive-phase and reverse-phase radio-frequency signals. In the following description, of differential signals, an output signal having a positive phase will be referred to as a "positive-phase output signal" and an output signal having a reverse-phase will be referred to as an "reverse-phase output signal."

The positive-phase output signal that is output from the balun DR21 is amplified by a transistor M21 of the amplification circuit AP21 and input to transistors M23 and M24 of the mixing circuit MX21. The reverse-phase output signal that is output from the balun DR21 is amplified by a transistor M22 of the amplification circuit AP21 and input to transistors M25 and M26 of the mixing circuit MX21.

The mixing circuit MX21 includes the transistors M23, M24, M25, and M26 and output loads R21 and R22. In the mixing circuit MX21, a positive-phase local signal is input to the gates of the transistors M23 and M26 via an input terminal Lop and a reverse-phase local signal is input to the gates of the transistors M24 and M25 via an input terminal Lon, whereby the transistors M23, M24, M25, and M26 are used as switching elements.

The mixing circuit MX21 mixes the positive-phase output signal and the reverse-phase output signal that are output from the amplification circuit AP21 with the positive-phase local signal and the reverse-phase local signal that are input to the transistors M23, M24, M25, and M26, and thereby down-converts the positive-phase output signal and the reverse-phase output signal that are output from the amplification circuit AP21 into differential IF signal.

The differential IF signals generated through the down conversion are switched alternately by the transistors M23, M24, M25, and M26 and thereby output to the respective output loads R21 and R22. Therefore, the conversion gain of the mixing circuit 20 is averaged through addition of a conversion gain for an IF positive-phase output signal and a conversion gain for an IF reverse-phase output signal. The IF signals are output to the outside of the mixing circuit 20 through output terminals IFp and IFn.

In order to use the mixing circuit 20 shown in FIG. 13 in a radio-frequency band, it is necessary to suppress lowering of the conversion gain of the mixing circuit 20, that is, to decrease the frequency deviation of the conversion gain of the mixing circuit 20, in a wide frequency band. In this connection, the circuit elements that cause a frequency deviation in the conversion gain of the mixing circuit 20 are the output loads of the mixing circuit MX21 and the input load and the output loads of the amplification circuit AP21.

When the output loads R21 and R22 of the mixing circuit MX21 are resistors, the frequency deviation in the conversion gain is small in the case of an IF signal in a band of several gigahertz, for example.

However, the use of a resistor(s) as the input load or the output loads of the amplification circuit AP21 increases the loss of a radio-frequency signal and hence degrades the NF (noise figure) characteristic which is a noise characteristic index. This makes it necessary to use, as a matching element(s), a passive element(s) (e.g., inductor or capacitor) which is small in loss though large in impedance frequency deviation.

Figure 12:
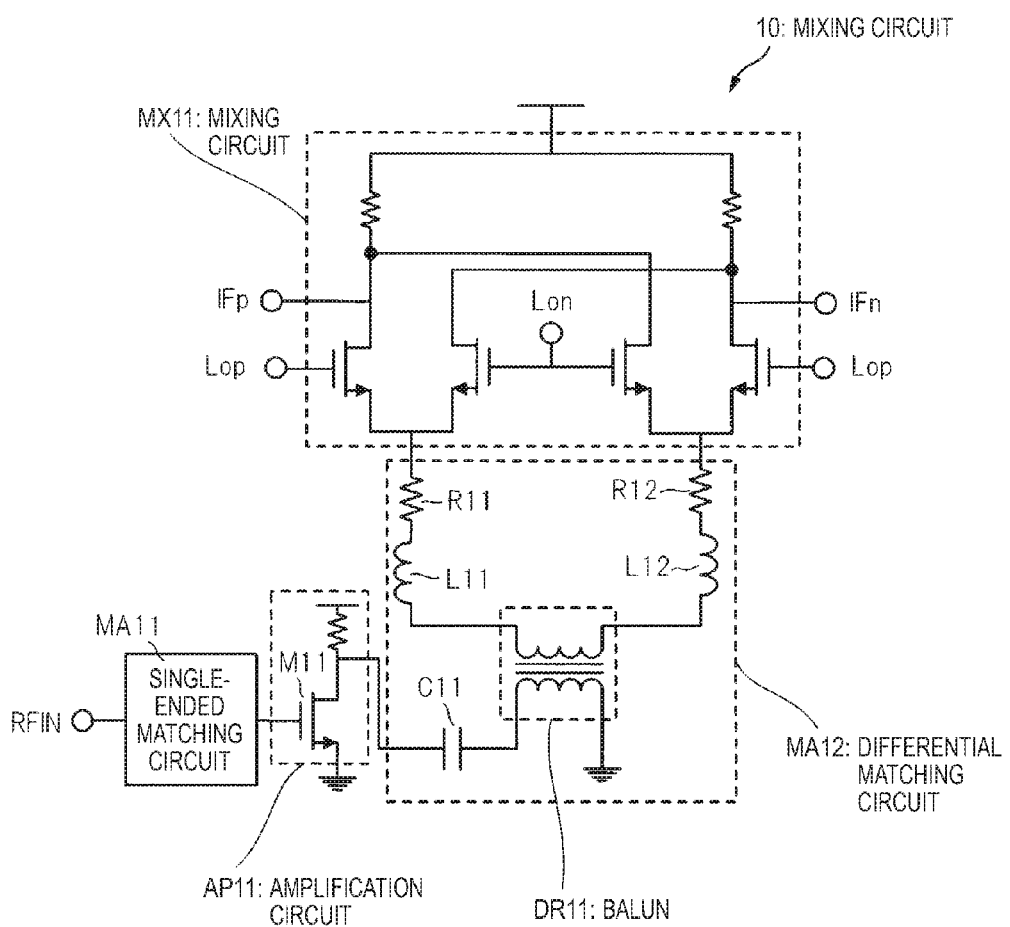
FIG. 12 shows the circuit configuration of a conventional mixing circuit.

The mixing circuit 10 shown in FIG. 12 may be used in a reception system circuit (e.g., a radio communication circuit of a TV tuner) in which the local signal frequency is varied to switch between plural channels that are set for respective prescribed frequency bands. To decrease the frequency deviation of the mixing circuit 10 in a wide frequency band that accommodates the plural channels, it is preferable to decrease the Q value of the matching circuit by doing impedance matching using resistors in the matching circuit of the mixing circuit 10. However, the addition of the resistors R11 and R12 increases the loss of a radio-frequency signal, which means a problem that the conversion gain of the mixing circuit 10 lowers.

In view of the above, the following embodiments have been conceived which are directed to specific example mixing circuits which are decreased in the frequency deviation of the conversion gain of conversion of an input radio-frequency signal into an IF signal and operates in a wide band.

Embodiment 1

Figure 1:
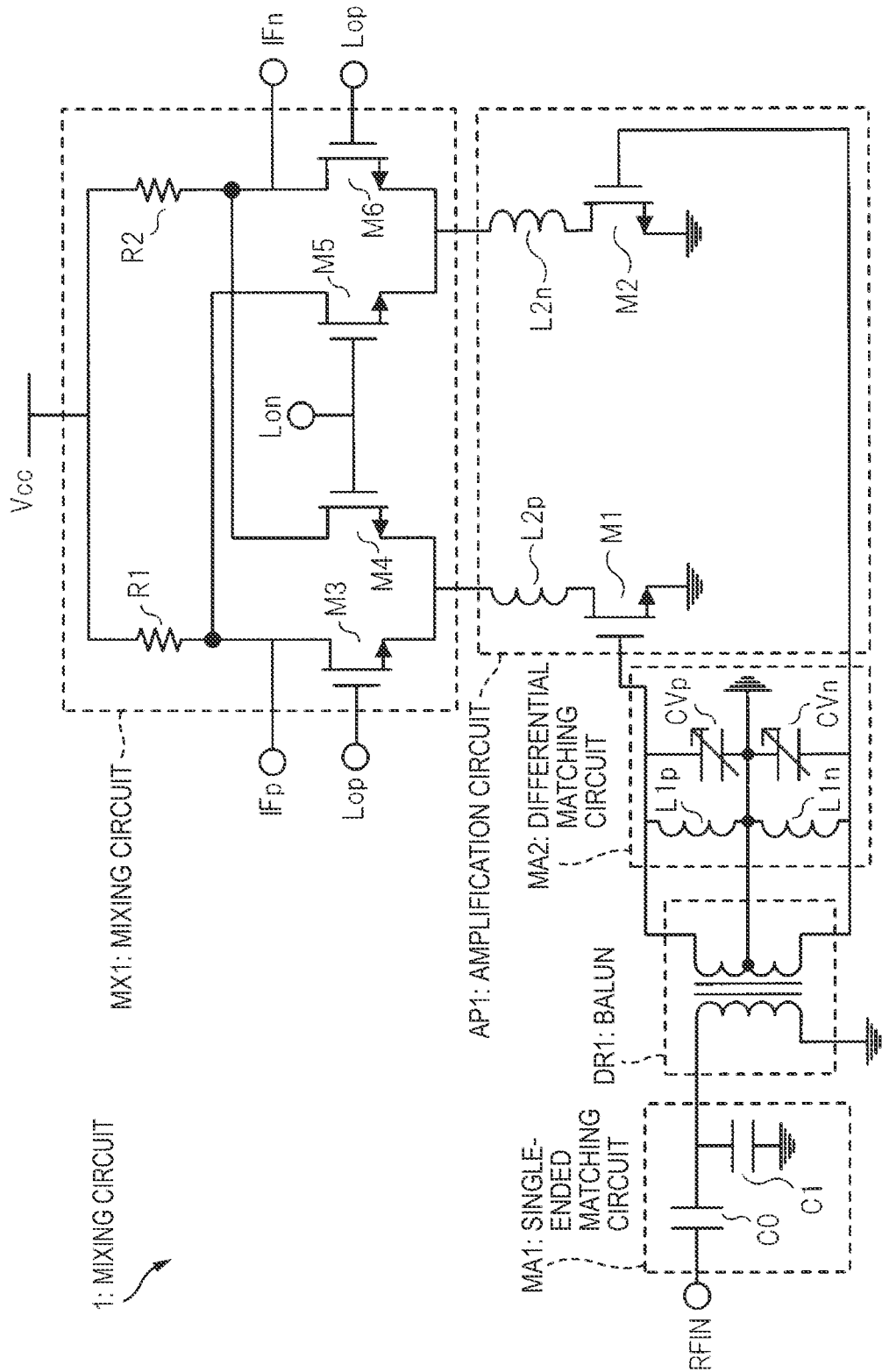
FIG. 1 shows the circuit configuration of a mixing circuit according to a first embodiment.

A mixing circuit 1 according to a first embodiment of the disclosure will be hereinafter described with reference to FIG. 1. FIG. 1 shows the circuit configuration of the mixing circuit 1 according to the first embodiment. The mixing circuit 1 shown in FIG. 1 includes a single-ended matching circuit MA1, a balun DR1, a differential matching circuit MA2, an amplification circuit AP1, and a mixing circuit MX1.

The single-ended matching circuit MA1 includes a capacitor C0 which is series-connected to a signal path (signal line) of a single-ended radio-frequency signal that is input to an input terminal RFIN and a capacitor C1 which is parallel-connected to the signal path of a single-ended radio-frequency signal. One end of the capacitor C1 is grounded. The single-ended matching circuit MA1 performs impedance matching according to an operation frequency band (e.g., a predetermined channel) of the mixing circuit 1 and thereby outputs a maximum-level radio-frequency signal to the balun DR1.

The balun DR1, which is formed using, for example, a transformer in which a primary inductor and a secondary inductor are coupled to each other inductively, converts a single-ended radio-frequency signal that is output from the single-ended matching circuit MA1 into differential radio-frequency signals. The differential signals, that is, a positive-phase output signal and a reverse-phase output signal, generated by the balun DR1 are input to the differential matching circuit MA2.

The differential matching circuit MA2 has an inductor L1$p$ and a variable capacitor CVp which are connected to each other in parallel and provided between the signal path of a positive-phase output signal of the balun DR1 and the ground and an inductor L1$n$ and a variable capacitor CVn which are connected to each other in parallel and provided between the signal path of a reverse-phase output signal of the balun DR1 and the ground. The capacitances of the variable capacitors CVp and CVn are varied according to control signals that are output from a control circuit (not shown). The inductors L1$p$ and L1$n$ have fixed inductance values.

The differential matching circuit MA2 produces a positive-phase output signal of the balun DR1 which has a maximum level at a frequency ω1 (described later) which is lower or higher than a resonance frequency (center frequency) through parallel resonance of the inductor L1$p$ and the variable capacitor CVp (matching elements) using the inductance of the inductor L1$p$ and the capacitance of the variable capacitor CVp, and outputs it to the amplification circuit AP1. The positive-phase output signal of the differential matching circuit MA2 is input to the gate of a transistor M1 of the amplification circuit AP1.

The differential matching circuit MA2 produces a reverse-phase output signal of the balun DR1 which has a maximum level at a frequency ω2 (described later) which is higher or lower than a resonance frequency (center frequency) through parallel resonance of the inductor L1$n$ and the variable capacitor CVn (matching elements) using the inductance of the inductor L1$n$ and the capacitance of the variable capacitor CVn, and outputs it to the amplification circuit AP1. The reverse-phase output signal of the differential matching circuit MA2 is input to the gate of a transistor M2 of the amplification circuit AP1.

Figure 2:
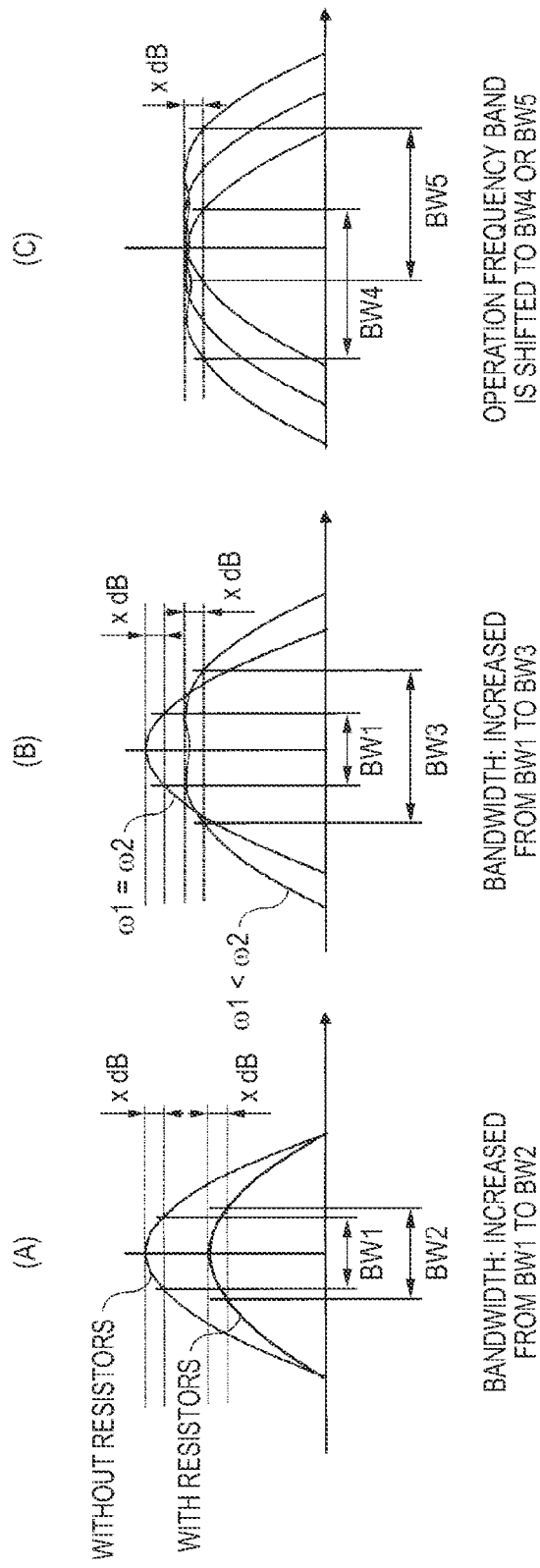
FIG. 2(A) illustrates bandwidths and conversion gain profiles of a conventional mixing circuit.
FIG. 2(B) illustrates bandwidths and conversion gain profiles of the mixing circuit according to the embodiment.
FIG. 2(C) illustrates how the bandwidth of the mixing circuit according to this embodiment varies when the resonance frequency is shifted to the low-frequency side or the high-frequency side.

Now, the bandwidth and the conversion gain of the mixing circuit 1 will be described with reference to FIG. 2. FIG. 2(A) illustrates bandwidths and conversion gain profiles of a conventional mixing circuit (e.g., the mixing circuit 10 shown in FIG. 12). FIG. 2(B) illustrates bandwidths and conversion gain profiles of the mixing circuit 1 according to this embodiment. FIG. 2(C) illustrates how the bandwidth of the mixing circuit 1 according to this embodiment varies the resonance frequency is shifted to the low-frequency side or the high-frequency side.

The circuit elements that cause a frequency deviation in the conversion gain of the mixing circuit 1 shown in FIG. 1 are output loads R1 and R2 of the mixing circuit MX1 and the input loads and the output loads of the amplification circuit AP1. When resistors are used as the output loads R1 and R2 of the mixing circuit MX1, the frequency deviation for an IF signal in a band of several gigahertz, for example, is small. In the following, consideration will be given to a method for decreasing the frequency deviation that is caused by the input and output loads of the amplification circuit AP1.

For example, in the conventional mixing circuit 10 shown in FIG. 12, the resistors R11 and R12 which are added so as to be series-connected to the respective output ends of the differential matching circuit MA12 as output loads of the amplification circuit decrease the Q value of the differential matching circuit MA12, whereby the frequency deviation of the differential matching circuit MA12 is decreased. FIG. 2(A) shows a frequency characteristic of the conversion gain of the mixing circuit 10 without the resistors R11 and R12 and a frequency characteristic of the conversion gain of the mixing circuit 10 with the resistors R11 and R12.

Since the resonance frequency of the differential matching circuit MA12 is not varied by presence/absence of the resistors R11 and R12 but the Q value of the differential matching circuit MA12 is in inverse proportion to the loss of a radio-frequency signal, as seen from FIG. 2(A) the addition of the resistors R11 and R12 increases the loss of a radio-frequency signal and lowers the conversion gain of the mixing circuit 10.

Assuming that the frequency-deviation-allowable bandwidth is, for example, a width corresponding to a conversion gain reduction of x (dB), the addition of the resistors R11 and R12 increases the bandwidth of the mixing circuit 10 from BW1 to BW2. However, to increase the bandwidth further, it is necessary to increase the resistances of the resistors R11 and R12 further, which results in a further reduction of the conversion gain of the mixing circuit 10. The resonance frequency for a radio-frequency signal shift, when the circuit constants (e.g., inductances or capacitances) of the single-ended matching circuit MA1 of the mixing circuit 10 are varied. However, this does not increase the bandwidth of the mixing circuit 10.

On the other hand, in this embodiment, the differential matching circuit MA2, which is the input load of the amplification circuit AP1, performs impedance matching to suppress reduction of the Q value of the differential matching circuit MA2 and to provide different respective resonance frequencies $\omega 1$ and $\omega 2$ for obtaining a maximum-level positive-phase output signal and reverse-phase output signal through parallel resonance of the inductor and the variable capacitor (see FIG. 2(B)).

More specifically, the differential matching circuit MA2 performs impedance matching to provide a resonance frequency $\omega 1$ for obtaining a maximum-level positive-phase output signal of the balun DR1 through parallel resonance of the inductor L1p and the variable capacitor CVp. At the same time, the differential matching circuit MA2 performs impedance matching to provide a resonance frequency $\omega 2$ for obtaining a maximum-level reverse-phase output signal of the balun DR1 through parallel resonance of the inductor L1n and the variable capacitor CVn.

For example, the inductors L1p and L1n have the same inductance value and the variable capacitors CVp and CVn have the same capacitance values, the resonance frequency $\omega 1$ for a positive-phase output signal of the balun DR1 and the resonance frequency $\omega 2$ for a reverse-phase output signal of the balun DR1 are identical ($\omega 1=\omega 2$). In this case, the conversion gain of the mixing circuit 1 is determined according to the arithmetic mean of conversion gains for a positive-phase output signal and a reverse-phase output signal in the amplification circuit AP1.

In this embodiment, to decrease the frequency deviation of the mixing circuit 1 and increase its bandwidth, the differential matching circuit MA2 shifts the resonance frequencies $\omega 1$ and $\omega 2$ for a positive-phase output signal and a reverse-phase output signal of the balun DR1 to the low-frequency side and the high-frequency side from the resonance frequency (center frequency) of a radio-frequency signal. For example, $\omega 1$ and $\omega 2$ are resonance frequencies for a positive-phase output signal and a reverse-phase output signal, respectively.

In this case, reduction of the Q value of the differential matching circuit MA2 is suppressed and hence lowering of the respective conversion gains for a positive-phase output signal and a reverse-phase output signal that are input to the amplification circuit AP1 is also suppressed. As a result, the conversion gain of the mixing circuit 1 according to this embodiment can be increased in a bandwidth (increased from BW1 to BW3) in which a frequency deviation (reduction) of x (dB) is permitted (see FIG. 2(B)).

Furthermore, the differential matching circuit MA2 can shift the operation frequency of a radio-frequency signal to the high-frequency side or the low-frequency side (see FIG. 2(C)) by varying the capacitances in the differential matching circuit MA2 in accordance with the operation frequency band (e.g., predetermined channel) of the mixing circuit 1. With this measure, the mixing circuit 1 according to this embodiment can shift the bandwidth of the mixing circuit 1 from BW3 (see FIG. 2(B)) to BW4 or BW5 (see FIG. 2(C)) according to plural channels.

The amplification circuit AP1 includes transistors M1 and M2 (amplification elements) and inductors L2p and L2n (matching elements). The gates of the transistors M1 and M2 are connected to the signal paths of a positive-phase output signal and a reverse-phase output signal of the differential matching circuit MA2, respectively, their sources are grounded, and their drains are series-connected to the respective inductors L2p and L2n.

The transistor M1 amplifies the signal level of a positive-phase output signal of the differential matching circuit MA2 and outputs the amplified positive-phase output signal to transistors M3 and M4 of the mixing circuit MX1 via the inductor L2p. The transistor M2 amplifies the signal level of a reverse-phase output signal of the differential matching circuit MA2 and outputs the amplified reverse-phase output signal to transistors M5 and M6 of the mixing circuit MX1 via the inductor L2n.

In the mixing circuit 1 to which a radio-frequency signal is input, grounded parasitic capacitances (not shown) occur between the output ends (drain sides) of the transistors M1 and M2 of the amplification circuit AP1 and the input ends (source sides) of the transistors M3 and M4 of the mixing circuit MX1. As a result, the impedances of the signal paths (signal line) through which differential radio-frequency signals flow decrease in accordance with increases of the combined capacitances of the parasitic capacitances.

In the mixing circuit 1 according to this embodiment, the inductor L2p (matching element) is provided between the output end (drain side) of the transistor M1 of the amplification circuit AP1 and the input ends (source sides) of the transistors M3 and M4 of the mixing circuit MX1. Likewise, the inductor L2n (matching element) is provided between the output end (drain side) of the transistor M2 of the amplification circuit AP1 and the input ends (source sides) of the transistors M5 and M6 of the mixing circuit MX1.

With this measure, by virtue of parallel resonance of the parasitic capacitances (not shown) and the inductors L2p and L2n, reduction of the impedance of the amplification circuit AP1 can be avoided in the operation frequency band of the mixing circuit 1, whereby the amplification circuit AP1 can output a maximum-level positive-phase output signal and reverse-phase output signal to the mixing circuit MX1.

The mixing circuit MX1 includes the transistors M3, M4, M5, and M6 and output loads R1 and R2 which are supplied with a power supply voltage Vcc. The mixing circuit MX1 receives differential output signals (positive-phase output signal and reverse-phase output signal) of the amplification circuit AP1 at the sources of the transistors M3, M4, M5, and M6.

In the mixing circuit MX1, a positive-phase local signal is input to the gates of the transistors M3 and M6 via an input terminal Lop and a reverse-phase local signal is input to the gates of the transistors M4 and M5 via an input terminal Lon, whereby the transistors M3, M4, M5, and M6 are used as switching elements.

In the mixing circuit MX1, the transistors M3, M4, M5, and M6 operate as switching elements each of which is turned on or off in units of a cycle of the positive-phase local signal or the reverse-phase local signal, and thereby down-convert the radio-frequency positive-phase output signal and reverse-phase output signal that are output from the amplification circuit AP1 into differential IF signals. The transistors M3, M4, M5, and M6 output, alternately, to the respective output loads R1 and R2, an intermediate-frequency (IF) positive-phase output signal and reverse-phase output signal that are generated through the down conversion.

Therefore, in the mixing circuit 1, the signal levels of differential IF signals that the mixing circuit MX1 outputs from the output terminals IFp and IFn are subjected to averaging, whereby the conversion gain of the mixing circuit 1 can be made uniform and the frequency deviation can be decreased.

As described above, in the mixing circuit 1 according to this embodiment, the differential matching circuit MA2 causes shifts from the resonance frequency for a radio-frequency signal that is input to the balun DR1 to a low-frequency side resonance frequency and a high-frequency-side resonance frequency and outputs a maximum-level positive-phase output signal having the low-frequency-side resonance frequency and a maximum-level reverse-phase output signal having the high-frequency-side resonance frequency.

The positive-phase output signal and the reverse-phase output signal as amplified by the amplification circuit AP1 are converted into IF signals alternately in the mixing circuit MX1, whereby the conversion gain of the mixing circuit 1 is averaged. As a result, the frequency deviation of the conversion gain of the mixing circuit 1 can be decreased and the bandwidth of the mixing circuit 1 can be increased. Furthermore, in the mixing circuit 1, the Q value of the differential matching circuit MA2 is not lowered and hence the degree of reduction of the conversion gain due to attenuation of differential radio-frequency signals in the differential matching circuit MA2 can be lowered.

Although in the differential matching circuit MA2 shown in FIG. 1 the inductances of the inductors L1$p$ and L1$n$ are fixed and the capacitances of the variable capacitors CVp and CVn are variable, a modification is possible in which the inductances are variable and the capacitances are fixed. In this case, inductance control signals are input to the respective inductors L1$p$ and L1$n$ from a control circuit (not shown).

(Mixing Circuit of Modification 1)

Figure 3:
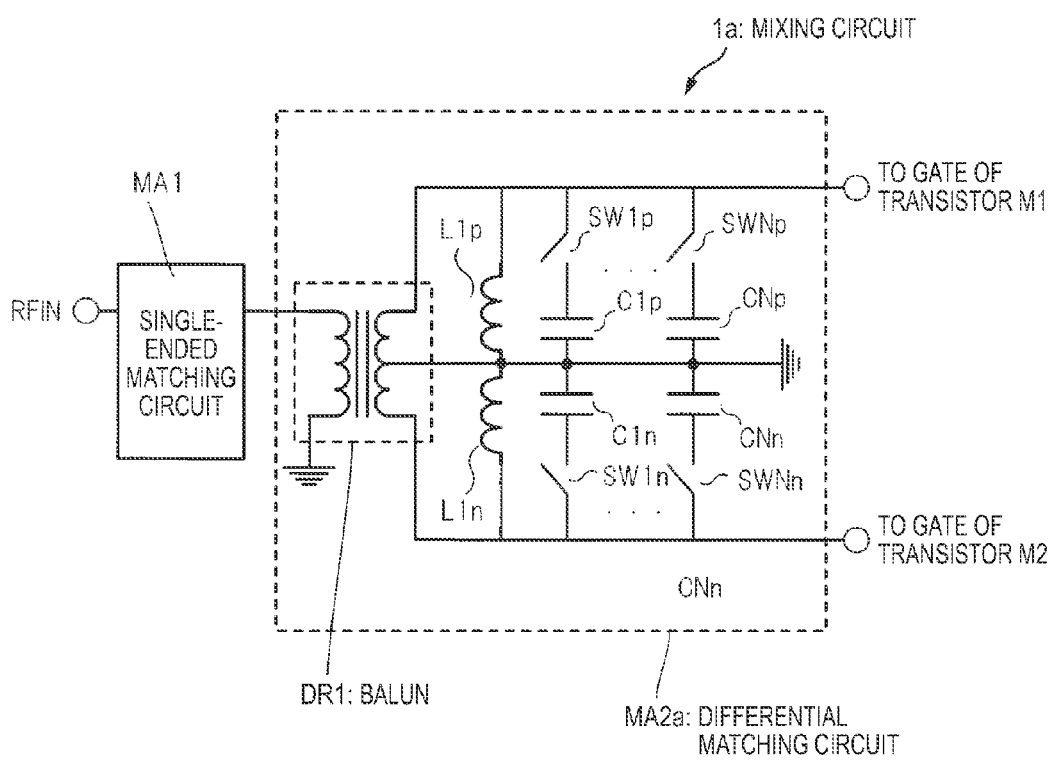
FIG. 3 shows the circuit configuration of a differential matching circuit of a mixing circuit according to a first modification of the embodiment.

Next, a mixing circuit 1$a$ according to a first modification of the embodiment will be described with reference to FIG. 3. FIG. 3 shows the circuit configuration of a differential matching circuit MA2$a$ of the mixing circuit 1$a$ according to the first modification of the embodiment. Circuit elements of the mixing circuit 1$a$ shown in FIG. 3 that have the same ones in the mixing circuit 1 shown in FIG. 1 will not be illustrated or described or will be illustrated or described in simplified manners. The differences will be described below.

The method for shifting the resonance frequencies for a positive-phase output signal and a reverse-phase output signal of the differential matching circuit MA2$a$ to different values ω1 and ω2 in the differential matching circuit MA2$a$ which is the input load of the amplification circuit AP1, to decrease the frequency deviation of the conversion gain of the mixing circuit 1 has been described in the first embodiment.

The first modification is directed to a method, which is different than in the first embodiment, for shifting the resonance frequencies for a positive-phase output signal and a reverse-phase output signal of the differential matching circuit MA2$a$ to different values ω1 and ω2 in the differential matching circuit MA2 which is the input load of the amplification circuit AP1, to decrease the frequency deviation of the conversion gain of the mixing circuit 1$a$.

The differential matching circuit MA2$a$ shown in FIG. 3 includes the balun DR1. In the differential matching circuit MA2$a$, an inductor L1$p$ and N capacitors C1$p$-CNp are connected to each other in parallel and provided between the signal path of a positive-phase output signal of the balun DR1 and the ground. Switches SW1$p$-SWNp are series-connected to the respective capacitors C1$p$-CNp. The capacitors C1$p$-CNp have different capacitance values. N is an integer that is larger than or equal to 1.

In the differential matching circuit MA2$a$, an inductor L1$n$ and N capacitors C1$n$-CNn are connected to each other in parallel and provided between the signal path of a reverse-phase output signal of the balun DR1 and the ground. Switches SW1$n$-SWNn are series-connected to the respective capacitors C1$n$-CNn. The capacitors C1$n$-CNn have different capacitance values.

In the differential matching circuit MA2$a$, at least one of the N switches SW1$p$-SWNp and at least one of the N switches SW1$n$-SWNn are turned on simultaneously according to control signal that are output from a control circuit (not shown). The number of switches, turned on by a control signal, of the N switches SW1$p$-SWNp is different from the number of switches, turned on by the control signal, of the N switches SW1$n$-SWNn.

For example, in the differential matching circuit MA2$a$, when the switch SW1$p$ which is series-connected to the capacitor C1$p$ is turned on among the switches SW1$p$-SWNp, a resonance frequency fcp for obtaining a maximum-level positive-phase output signal of the differential matching circuit MA2$a$ is determined by the inductance value L1$pl$ of the inductor L$i$p and the capacitance value C1$pc$ of the capacitor C1$p$ (see Equation (1)).

[Formula 1]

$$fcp = \frac{1}{2\pi\sqrt{L1pl * C1pc}} \quad (1)$$

As described above, in the mixing circuit 1$a$ according to the first modification, the differential matching circuit MA2$a$ can shift the resonance frequency ω1 for obtaining a maximum-level positive-phase output signal of the differential matching circuit MA2$a$ to a different value than the resonance frequency ω2 by turning on at least one of the N switches SW1$p$-SWNp for the N capacitors C1$p$-CNp having different capacitance values.

And the differential matching circuit MA2$a$ can shift the resonance frequency ω2 for obtaining a maximum-level reverse-phase output signal of the differential matching circuit MA2$a$ to a different value than the resonance frequency ω1 by turning on at least one of the N switches SW1$n$-SWNn for the N capacitors C1$n$-CNn having different capacitance values.

In the mixing circuit 1$a$ according to the first modification, when the center frequency of local signals that are input to the mixing circuit MX1 is switched according to preset frequency intervals, the switches SW1$p$-SWNp and the switches SW1$n$-SWNn of the differential matching circuit MA2$a$ are controlled simultaneously to vary the capacitances of capacitors to operate.

In this manner, in the mixing circuit 1$a$, the resonance frequencies ω1 and ω2 of a positive-phase output signal and a reverse-phase output signal of the balun DR1 can be shifted by a frequency that is equal to the shift from the center frequency of the local signals. That is, the mixing circuit 1$a$ can output differential IF signals with a decreased frequency deviation irrespective of switching of the frequency of local signals.

Where the balun DR1 is formed using a transformer, the secondary inductor of the balun DR1 can be used as the inductors of the differential matching circuit MA2$a$ shown in FIG. 3. In this case, the inductors L1$p$ and L1$n$ of the differential matching circuit MA2$a$ shown in FIG. 3 can be omitted.

(Mixing Circuit of Modification 2)

Figure 4:
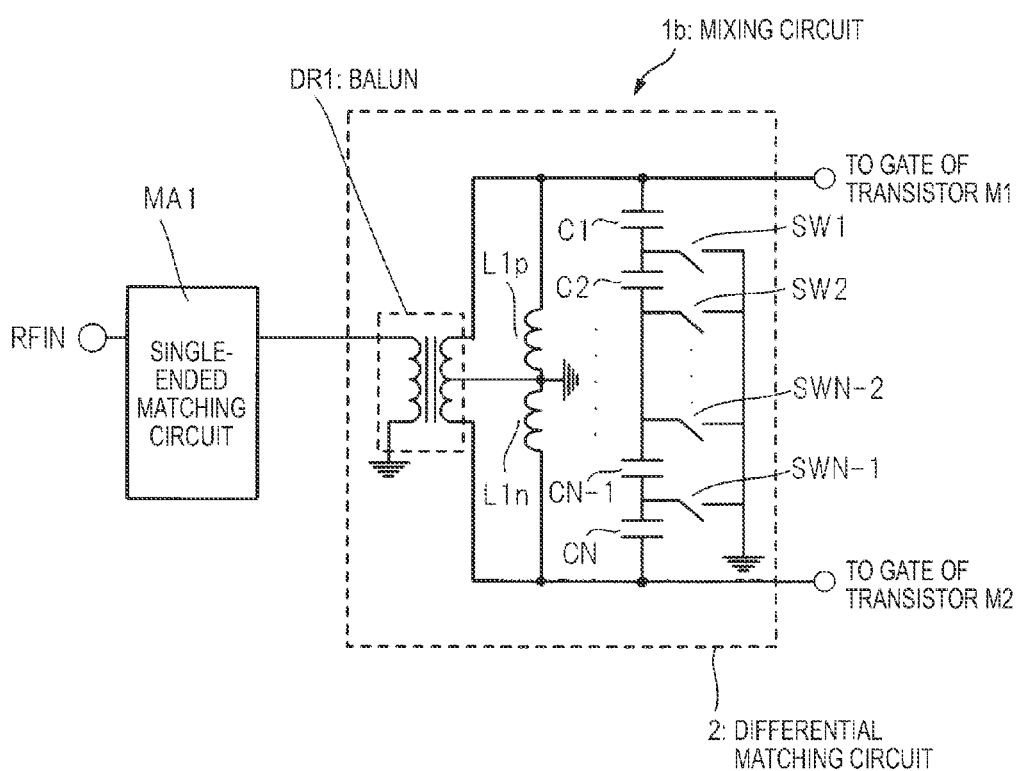
FIG. 4 shows the circuit configuration of a differential matching circuit of a mixing circuit according to a second modification of the embodiment.

Next, a mixing circuit 1$b$ according to a second modification of the embodiment will be described with reference to FIG. 4. FIG. 4 shows the circuit configuration of a differential matching circuit MA2$b$ of the mixing circuit 1$b$ according to the second modification of the embodiment. Circuit elements of the mixing circuit 1*b* shown in FIG. 4 that have the same ones in the mixing circuit 1 shown in FIG. 1 will not be illustrated or described or will be illustrated or described in simplified manners. The differences will be described below.

The method for shifting the resonance frequencies for a positive-phase output signal and a reverse-phase output signal of the differential matching circuit MA2 to different values ω1 and ω2 in the differential matching circuit MA2 which is the input load of the amplification circuit AP1, to decrease the frequency deviation of the conversion gain of the mixing circuit 1 has been described in the first to embodiment.

The second modification is directed to a method, which is different than in the first embodiment, for shifting the resonance frequencies for a positive-phase output signal and a reverse-phase output signal of the differential matching circuit is MA2*b* to different values ω1 and ω2 in the differential matching circuit MA2*b* which is the input load of the amplification circuit AP1, to decrease the frequency deviation of the conversion gain of the mixing circuit 1*b*.

The differential matching circuit MA2*b* shown in FIG. 4 includes the balun DR1. In the differential matching circuit MA2*b*, a series connection of N capacitors C1-CN is connected between the signal paths of a positive-phase output signal and a reverse-phase output signal of the balun DR1. The capacitors C1-CN may include ones having the same capacitance value or different capacitance values unless all of them have the same capacitance value.

In the differential matching circuit MA2*b*, a pair of inductors L1*p* and L1*n* which are series-connected to each other are connected between the ground and the signal paths of a reverse-phase output signal of the balun DR1, respectively.

Furthermore, in the differential matching circuit MA2*b*, the connecting points of the capacitors C1-CN are grounded via a total of (N−1) switches SW1 to SWN−1, respectively. More specifically, the connecting point of the capacitors C1 and C2 is grounded via the switch SW1 and so forth. The connecting point of the capacitors CN−1 and CN is grounded via the switch SWN−1.

In the differential matching circuit MA2*b*, at least one of the (N−1) switches SW1 to SWN−1 is turned on according to a control signal that is output from a control circuit (not shown). With this measure, in the differential matching circuit MA2*b*, the number of series-connected switches located between the signal path of a positive-phase output signal of the balun DR1 and the turned-on switch is different from the number of series-connected switches located between the signal path of a reverse-phase output signal of the balun DR1 and the turned-on switch are made different from each other.

For example, when the switch SWN−2 is turned on, the resonance frequency ω1 for obtaining a maximum-level positive-phase output signal of the balun DR1 is determined in accordance with the series combined capacitance value of the capacitors C1 to CN−2 (not shown) and the resonance frequency ω2 for obtaining a maximum-level reverse-phase output signal of the balun DR1 is determined in accordance with the series combined capacitance value of the capacitors CN−1 to CN.

With the above configuration, in the mixing circuit 1*b* according to the second modification, the differential matching circuit MA2*b* can shift the resonance frequency ω1 for obtaining a maximum-level positive-phase output signal of the differential matching circuit MA2*b* to a different value than the resonance frequency ω2 by turning on at least one of the (N−1) switches SW1 to SWN−1 for the N capacitors C1-CN.

In the mixing circuit 1*b* according to the second modification, the differential matching circuit MA2*b* can shift the resonance frequency ω2 for obtaining a maximum-level reverse-phase output signal of the differential matching circuit MA2*b* to a different value than the resonance frequency ω1 by turning on at least one of the (N−1) switches SW1 to SWN−1 for the N capacitors C1-CN.

In the mixing circuit 1*b* according to the second modification, since in the differential matching circuit MA2*b* the series connection of the N capacitors C1-CN is connected between the signal paths of a positive-phase output signal and a reverse-phase output signal of the balun DR1, the numbers of capacitors and switches can be made smaller than in the differential matching circuit MA2*b* shown in FIG. 3 and the mixing circuit 1*b* is thus simpler.

Furthermore, in the mixing circuit 1*b*, the wiring capacitance for a radio-frequency signal is not increased because the capacitors are connected at a total of two points to the signal paths (signal lines) of a positive-phase output signal and a reverse-phase output signal of the balun DR1. Therefore, in the differential matching circuit MA2*b*, the degree of reduction of the Q value can be made lower than in the differential matching circuit MA2*a* in which the plural switches are connected to each other in parallel. Therefore, lowering of the conversion gain can be avoided in the mixing circuit MX1*b*.

In the mixing circuit 1*b* according to the second modification, when the center frequency of local signals that are input to the mixing circuit MX1 is switched according to preset frequency intervals, one of the switches SW1 to SWN−1 of the differential matching circuit MA2*b* is turned on to vary the capacitances of sets of capacitors.

In this manner, in the mixing circuit 1*b*, the resonance frequencies ω1 and ω2 of a positive-phase output signal and a reverse-phase output signal of the balun DR1 can be shifted by a frequency that is equal to the shift from the center frequency of the local signals. That is, the mixing circuit 1*b* can output differential IF signals with a decreased frequency deviation irrespective of switching of the frequency of local signals.

(Mixing Circuit of Modification 3)

Figure 5:
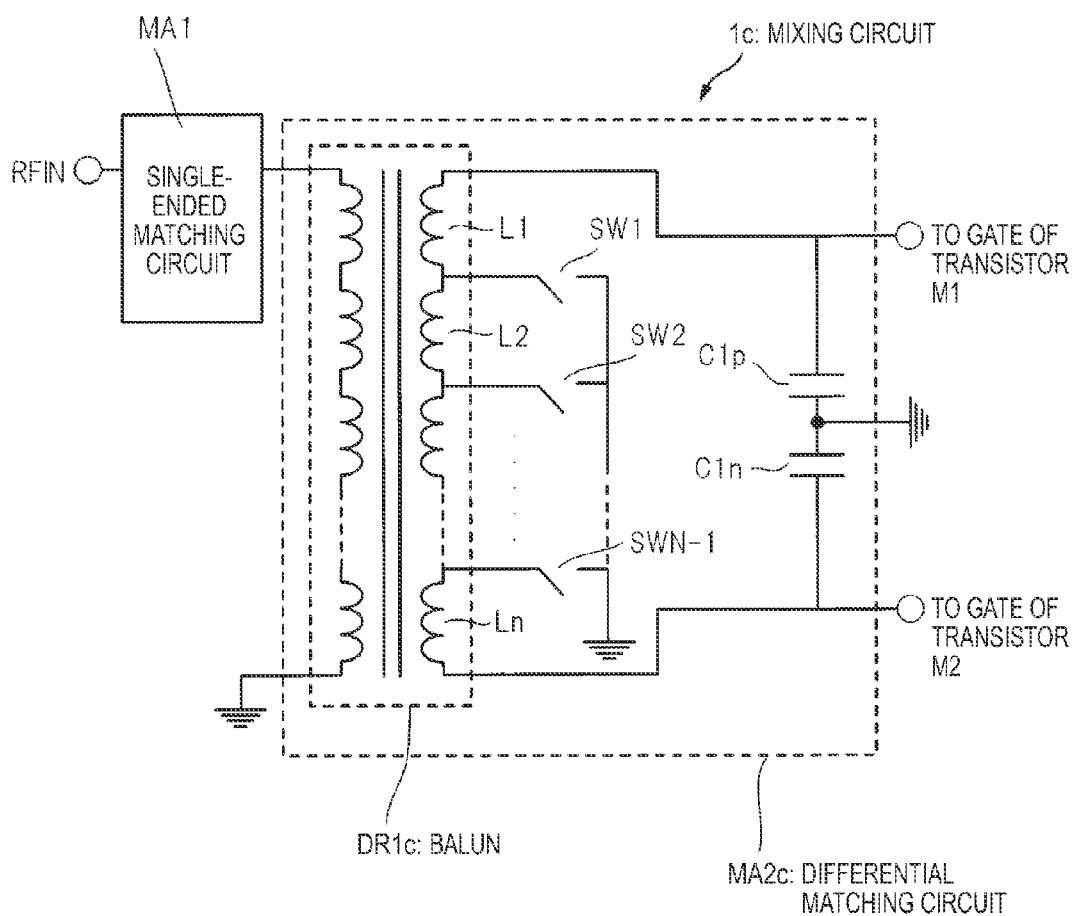
FIG. 5 shows the circuit configuration of a differential matching circuit of a mixing circuit according to a third modification of the embodiment.

Next, a mixing circuit 1*c* according to a third modification of the embodiment will be described with reference to FIG. 5. FIG. 5 shows the circuit configuration of a differential matching circuit MA2*c* of the mixing circuit 1*c* according to the third modification of the embodiment. Circuit elements of the mixing circuit 1*c* shown in FIG. 5 that have the same ones in the mixing circuit 1 shown in FIG. 1 will not be illustrated or described or will be illustrated or described in simplified manners. The differences will be described below.

The method for shifting the resonance frequencies for a positive-phase output signal and a reverse-phase output signal of the differential matching circuit MA2 to different values ω1 and ω2 in the differential matching circuit MA2 which is the input load of the amplification circuit AP1, to decrease the frequency deviation of the conversion gain of the mixing circuit 1 has been described in the first embodiment.

The third modification is directed to a method, which is different than in the first embodiment, for shifting the resonance frequencies for a positive-phase output signal and a reverse-phase output signal of the differential matching circuit MA2*c* to different values ω1 and ω2 in the differential matching circuit MA2*c* which is the input load of the amplification circuit AP1, to decrease the frequency deviation of the conversion gain of the mixing circuit 1*c*.

The differential matching circuit MA2*c* shown in FIG. 5 includes a balun DR1*c* which is, for example, a transformer in which a primary inductor and a secondary inductor are connected to each other inductively. One end of the primary inductor is connected to the signal path of an output signal of the single-ended matching circuit MA1 and the other end is grounded.

The secondary inductor is a series connection of N inductors L1, L2, . . . , LN which is provided between the signal paths of a positive-phase output signal and a reverse-phase output signal of the balun DR1c. The inductors L1-LN have different inductance values. In the secondary inductor, to output differential positive-phase and reverse-phase output signals, the connecting points of the inductors are grounded.

In the differential matching circuit 2c, the connecting points of the inductors are grounded via respective switches. For example, the connecting point of the inductors L1 and L2 is grounded via a switch SW1.

In the differential matching circuit MA2c, a pair of capacitors C1p and C1n which are series-connected to each other is connected between the signal paths of a positive-phase output signal and a reverse-phase output signal of the balun DR1c. The connecting point of the capacitors C1p and C1n is grounded.

In the differential matching circuit MA2c, at least one of the (N−1) switches SW1, SW2, . . . , SWN−1 is turned on according to a control signal that is output from a control circuit (not shown). With this measure, in the differential matching circuit MA2c, the number of series-connected switches located between the signal path of a positive-phase output signal of the balun DR1c and the turned-on switch is different from the number of series-connected switches located between the signal path of a reverse-phase output signal of the balun DR1c and the turned-on switch are made different from each other.

For example, when the switch SW2 is turned on, the resonance frequency ω1 for obtaining a maximum-level positive-phase output signal of the balun DR1 is determined in accordance with the series combined capacitance value of the inductors L1 and L2 (not shown) and the resonance frequency ω2 for obtaining a maximum-level reverse-phase output signal of the balun DR1 is determined in accordance with the series combined inductance value of the inductors L3 (not shown) to LN.

With the above configuration, in the mixing circuit 1b according to the third modification, the differential matching circuit MA2c can shift the resonance frequency ω1 for obtaining a maximum-level positive-phase output signal of the differential matching circuit MA2c to a different value than the resonance frequency ω2 by turning on at least one of the (N−1) switches SW1 to SWN−1 for the N inductors L1-LN which constitute the secondary inductor of the balun DR1c.

In the mixing circuit 1b according to the third modification, the differential matching circuit MA2c can shift the resonance frequency ω2 for obtaining a maximum-level reverse-phase output signal of the differential matching circuit MA2c to a different value than the resonance frequency ω1 by turning on at least one of the (N−1) switches SW1 to SWN−1 for the N inductors L1-LN which constitute the secondary inductor of the balun DR1c.

The secondary inductor of the balun DR1c used in the third embodiment is the series connection of the N inductors L1-LN. Therefore, by turning on one of switches SW1 to SWN−1 for grounding the respective connecting points of the inductors L1-LN, the series combined inductance values of the sets of series-connected inductors located between the ground and the turned-on switch can be set in a simple manner as the inductance values on the positive-phase side and reverse-phase side differential outputs of the balun DR1c.

That is, by turning on one of switches SW1 to SWN−1, the balun DR1c can shift the inductance values on the positive-phase side and reverse-phase side differential outputs of the balun DR1c from the inductance value of the inductor L1 and the series combined inductance value of the inductors L2-LN to the series combined inductance value of the inductors L1 to LN−1 and the inductance value of the inductor LN.

As a result, in the mixing circuit 1c according to the third modification, since the inductance values on the positive-phase side and reverse-phase side differential outputs of the balun DR1c can be shifted in a simple manner using one switch, the number of switches can be decreased and the differential matching circuit MA2c is thus simpler.

Whereas the parallel resonance frequency of an inductor and a capacitor is given by an equation like Equation (1), the impedance Z_LC of the differential matching circuit MA2c is given by Equation (2). Therefore, the impedance Z_LC can be made larger when the resonance frequency fcp is lowered by increasing the inductance of the inductor than when it is lowered by increasing the capacitance of the capacitor.

[Formula 2]

$$Z\_LC = \frac{j\omega L}{1 - \omega^2 LC} \qquad (2)$$

Since as described above the impedance of the differential matching circuit MA2c can be made larger when the resonance frequency fcp of the differential matching circuit MA2c is shifted to a lower frequency by increasing the inductance than when it is lowered by increasing the capacitance of the capacitor, the mixing circuit 1c can lower the degree of reduction of the conversion gain in a low frequency band.

In the mixing circuit 1c according to the third modification, when the center frequency of local signals that are input to the mixing circuit MX1 is switched according to preset frequency intervals, one of the switches SW1 to SWN−1 of the differential matching circuit MA2c is turned on to vary the inductances of sets of inductors.

In this manner, in the mixing circuit 1c, the resonance frequencies ω1 and ω2 of a positive-phase output signal and a reverse-phase output signal of the balun DR1c can be shifted by a frequency that is equal to the shift from the center frequency of the local signals. That is, the mixing circuit 1c can output differential IF signals with an improved frequency deviation characteristic irrespective of switching of the frequency of local signals.

(Mixing Circuit of Modification 4)

Figure 6:
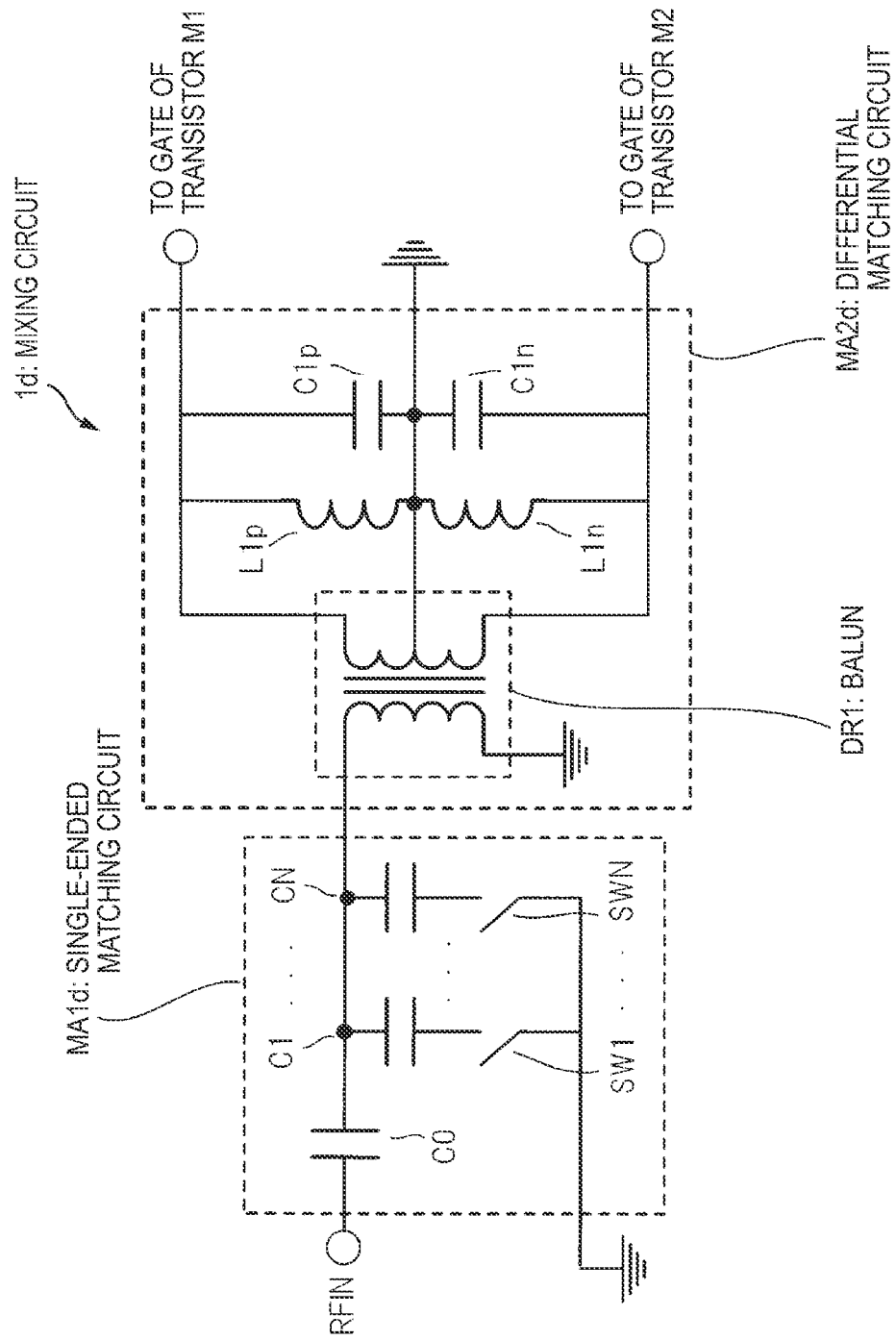
FIG. 6 shows the circuit configurations of a single-ended matching circuit and a differential matching circuit of a mixing circuit according to a fourth modification of the embodiment.

Next, a mixing circuit 1d according to a fourth modification of the embodiment will be described with reference to FIG. 6. FIG. 6 shows the circuit configuration of a single-ended matching circuit MA1d and a differential matching circuit MA2d of the mixing circuit 1d according to the fourth modification of the embodiment. Circuit elements of the mixing circuit 1d shown in FIG. 6 that have the same ones in the mixing circuit 1 shown in FIG. 1 will not be illustrated or described or will be illustrated or described in simplified manners. The differences will be described below.

The fourth modification is directed to a method for decreasing the frequency deviation of the conversion gain of the mixing circuit 1d by means of the differential matching circuit MA2d and shifting the operation frequency band of the mixing circuit 1d by means of the single-ended matching circuit MA1d.

The single-ended matching circuit MA1d shown in FIG. 6 includes a capacitor C0 which is series-connected to the signal path of a single-ended radio-frequency signal that is input to an input terminal RFIN and plural capacitors C1-CN which are connected to each other in parallel and provided between the signal path of a single-ended radio-frequency signal and the ground. One ends of the capacitors C1-CN are connected to the signal path of a single-ended radio-frequency signal and the other ends are grounded via respective switches SW1-SWN. The switches SW1-SWN which are connected to the respective capacitors C1-CN are turned on according to control signals that are output from a control circuit (not shown).

The single-ended matching circuit MA1d shifts the operation frequency (center frequency) of a radio-frequency signal when at least one of the switches SW1-SWN is turned on. For example, where the mixing circuit 1d is used in a wireless communication apparatus that accommodates multiple channels, the mixing circuit 1d shifts the operation frequency (center frequency) of a radio-frequency signal using the single-ended matching circuit MA1d in accordance with a communication channel. The single-ended matching circuit MA1d outputs a maximum-level radio-frequency signal to the balun DR1 by making matching to an impedance corresponding to the communication channel.

The differential matching circuit MA2d has an inductor L1p and a capacitor C1p which are connected to each other in parallel and provided between the signal path of a positive-phase output signal of the balun DR1 and the ground and an inductor L1n and a capacitor C1n which are connected to each other in parallel and provided between the signal path of a reverse-phase output signal of the balun DR1 and the ground. The inductances of the inductors L1p and L1n are fixed and the capacitances of the capacitors C1p and C1n are also fixed. Therefore, the Q value of the differential matching circuit MA2d is not reduced.

Figure 7:
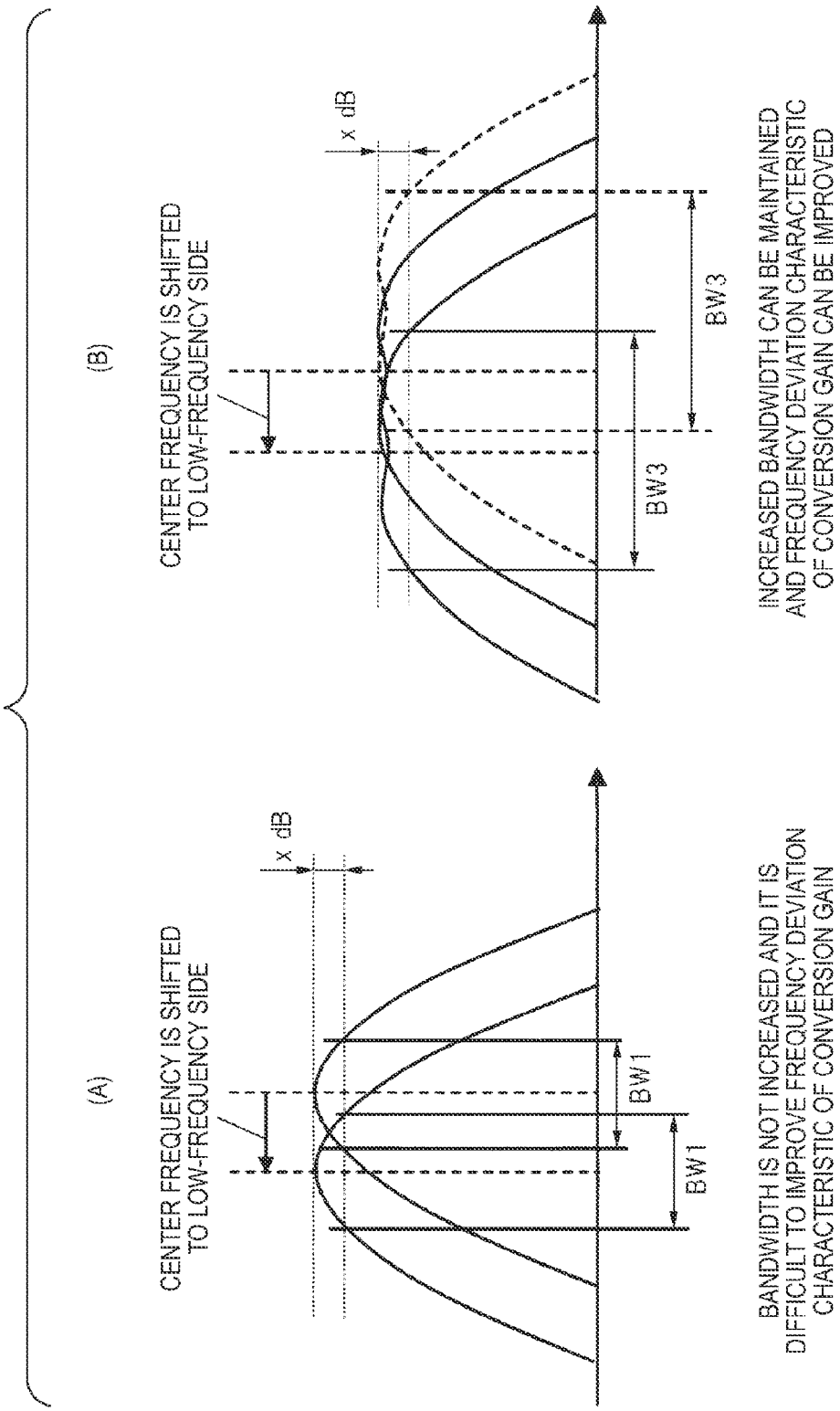
FIG. 7(A) illustrates how the bandwidth and the conversion gain profile vary when the single-ended matching circuit of a conventional mixing circuit shifts the center frequency.
FIG. 7(B) illustrates how the bandwidth and the conversion gain profile vary when the single-ended matching circuit of the mixing circuit according to the embodiment shifts the center frequency.

FIG. 7(A) illustrates how the bandwidth and the conversion gain profile vary when the single-ended matching circuit MA11 of a conventional mixing circuit (e.g., the mixing circuit 10 shown in FIG. 12) shifts the center frequency. FIG. 7(B) illustrates how the bandwidth and the conversion gain profile vary when the single-ended matching circuit MA1d of the mixing circuit 1d according to the embodiment shifts the center frequency.

In both of the conventional mixing circuit 10 and the mixing circuit 1d according to the fourth modification, the bandwidth of the mixing circuit does not vary even though the differential matching circuit shifts the center frequency of a radio-frequency signal. Therefore, the conversion gains shown in FIGS. 7(A) and 7(B) are kept the same even though the center frequency of a radio-frequency signal that is input to the mixing circuit is shifted.

However, in the conventional mixing circuit 10, since a radio-frequency positive-phase output signal and reverse-phase output signal in the differential matching circuit MA12 have the same center frequency, it is difficult to improve the intra-band deviation characteristic of an IF signal even though the input frequency range of a radio-frequency signal that is input to the mixing circuit 10 can be increased (see FIG. 7(A)).

On the other hand, in the mixing circuit 1d according to the fourth modification, the inductances of the inductors L1p and L1n and the capacitances of the capacitors C1p and C1n of the differential matching circuit MA2d are set to such values that the center frequencies of a radio-frequency positive-phase output signal and reverse-phase output signal are shifted to the low-frequency side and the high-frequency side, respectively.

AS described above, in the mixing circuit 1d according to the fourth modification, the local signals used in the mixing circuit MX1 can be made multi-channel ones and be shifted by shifting the center frequency of a radio-frequency signal. Furthermore, since the differential matching circuit MA2d can output a maximum gain positive-phase output signal and reverse-phase output signal, the mixing circuit 1d can attain a conversion gain with a bandwidth-increased IF signal.

In the mixing circuit 1d, the center frequency of a single-ended radio-frequency signal is shifted in the single-ended matching circuit MA1d whereas the center frequency is not shifted in the differential matching circuit MA2d. This makes it possible to suppress reduction of the Q value of the differential matching circuit MA2d and simplify the circuit configuration.

(Mixing Circuit of Modification 5)

Figure 8:
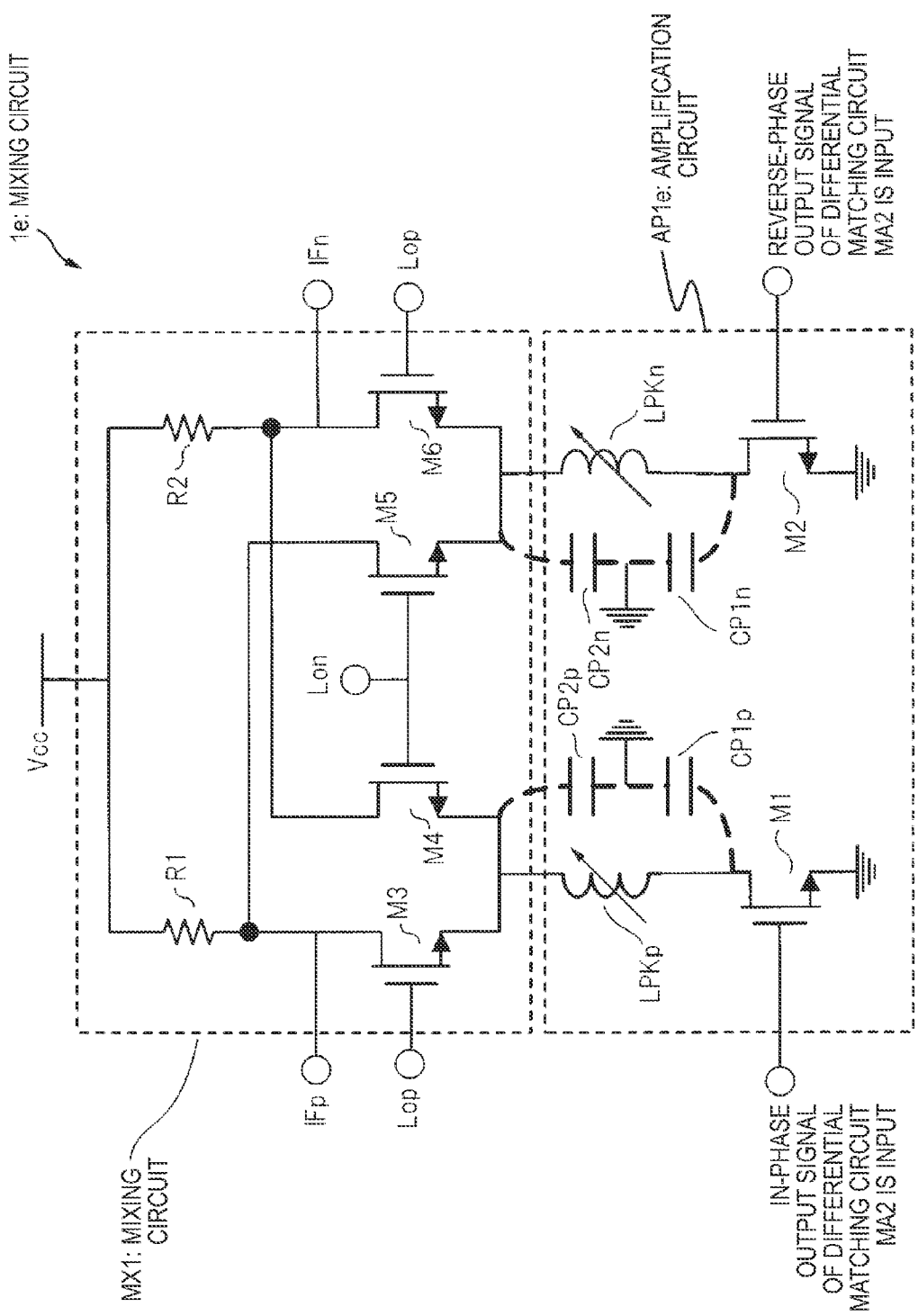
FIG. 8 shows the circuit configuration of an output load of an amplification circuit of a mixing circuit according to a fifth modification of the embodiment.

Next, a mixing circuit 1e according to a fifth modification of the embodiment will be described with reference to FIG. 8. FIG. 8 shows the circuit configuration of an output load of an amplification circuit AP1e of the mixing circuit 1e according to the fifth modification of the embodiment. Circuit elements of the mixing circuit 1e shown in FIG. 8 that have the same ones in the mixing circuit 1 shown in FIG. 1 will not be illustrated or described or will be illustrated or described in simplified manners. The differences will be described below.

The method for shifting the resonance frequencies for a positive-phase output signal and a reverse-phase output signal of the differential matching circuit to different values $\omega 1$ and $\omega 2$ in the differential matching circuit which is the input load of the amplification circuit, to decrease the frequency deviation of the conversion gain of the mixing circuit has been described in each of the above embodiment and modifications.

However, the frequency deviation characteristic of a positive-phase output signal and a reverse-phase output signal of the amplification circuit may not be improved sufficiently depending on the manner of impedance matching for the output load of the amplification circuit. In view of this, it preferable to perform impedance matching for the output load of the amplification circuit as well as for the differential matching circuit which is the input load of the amplification circuit.

Thus, the fifth medication is directed to a method for shifting the resonance frequencies for a positive-phase output signal and a reverse-phase output signal of the amplification circuit AP1e to different values $\omega 1$ and $\omega 2$ by performing impedance matching for the output load of the amplification circuit AP1e, to decrease the frequency deviation of the conversion gain, that is, to lower the degree of reduction of the conversion gain, of the mixing circuit 1e.

In the amplification circuit AP1e shown in FIG. 8, a parasitic capacitance CP1p occurs parallel with the signal path of a positive-phase output signal of the amplification circuit AP1e and a parasitic capacitance CP1n occurs parallel with the signal path of a reverse-phase output signal of the amplification circuit AP1e. Furthermore, a parasitic capacitance CP2p occurs at the input ends of the transistors M3 and M4 of the mixing circuit MX1 and a parasitic capacitance CP2n occurs at the input ends of the transistors M5 and M6 of the mixing circuit MX1.

The parasitic capacitances CP1p and CP2p occur in series and are grounded, and parasitic capacitances CP1n and CP2n occur in series and are grounded. Since the parasitic capacitances CP1p, CP2p, CP1n, and CP2n thus occur as part of the output load of the amplification circuit AP1e, the impedance of the output load of the amplification circuit AP1e is reduced (see Equation (1)).

In the fifth modification, a variable inductor LPKp whose inductance is variable is added between the output end of the transistor M1 of the amplification circuit AP1e and the input ends of the transistors M3 and M4 of the mixing circuit MX1. And a variable inductor LPKn whose inductance is variable is added between the output end of the transistor M2 of the amplification circuit AP1e and the input ends of the transistors M5 and M6 of the mixing circuit MX1.

The inductances of the variable inductors LPKp and LPKn are varied according to respective control signals that are output from a control circuit (not shown). The control signals to be input to the variable inductors LPKp and LPKn are output from the control circuit simultaneously with the control signals to be input to the variable capacitors CVp and CVn of the differential matching circuit MA2 (see FIG. 1).

The amplification circuit AP1e can perform proper matching while lowering the degree of impedance reduction in the operation frequency band of the mixing circuit 1e though the parallel resonance of the variable inductors LPKp and LPKn and the parasitic capacitances CP1$p$, CP2$p$, CP1$n$, and CP2$n$.

For example, the inductance LPKpl of the variable inductor LPKp is given by Equation (3) where CPp is the combined capacitance of the parasitic capacitances CP1$p$ and CP2$p$ and fp is the resonance frequency. The resonance frequency fp is given by Equation (4).

Likewise, the inductance LPKnl of the variable inductor LPKn is given by Equation (5) where CPn is the combined capacitance of the parasitic capacitances CP1$n$ and CP2$n$ and fn is the resonance frequency. The resonance frequency fn is given by Equation (6).

[Formula 3]
$$LPKpl = \frac{1}{CPp \times (2\pi fp)^2} \quad (3)$$

[Formula 4]
$$fp = \frac{1}{2\pi\sqrt{LPKpl \times CPp}} \quad (4)$$

[Formula 5]
$$LPKnl = \frac{1}{CPn \times (2\pi fn)^2} \quad (5)$$

[Formula 6]
$$fn = \frac{1}{2\pi\sqrt{LPKnl \times CPn}} \quad (6)$$

Figure 9:
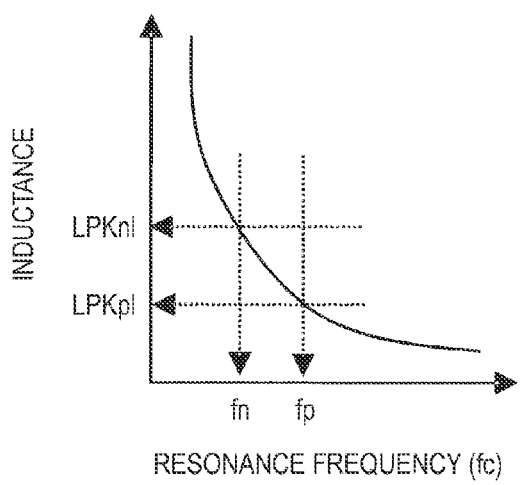
FIG. 9 is a graph showing relationships between the resonance frequencies for a positive-phase output signal and a reverse-phase output signal amplified by the amplification circuit and the inductance values of variable inductors.

FIG. 9 is a graph showing relationships between the resonance frequencies fp and fn for a positive-phase output signal and a reverse-phase output signal amplified by the amplification circuit AP1e and the inductance values LPKpl and LPKnl of the variable inductors LPKp and LPKn.

For example, when the resonance frequency fn for a reverse-phase output signal of the amplification circuit AP1e is set lower than the resonance frequency fp for a positive-phase output signal of the amplification circuit AP1e (see FIG. 9), the inductance value LPKnl of the variable inductor LPKn is set larger than the inductance value LPKpl of the variable inductor LPKp.

With the above measures, in the mixing circuit 1e, the resonance frequencies for a positive-phase output signal and a reverse-phase output signal of the amplification circuit AP1e can be set properly, impedance reduction of the output load of the amplification circuit AP1e can be avoided, and the degree of reduction of the conversion gain for an IF signal can be lowered.

Figure 14:
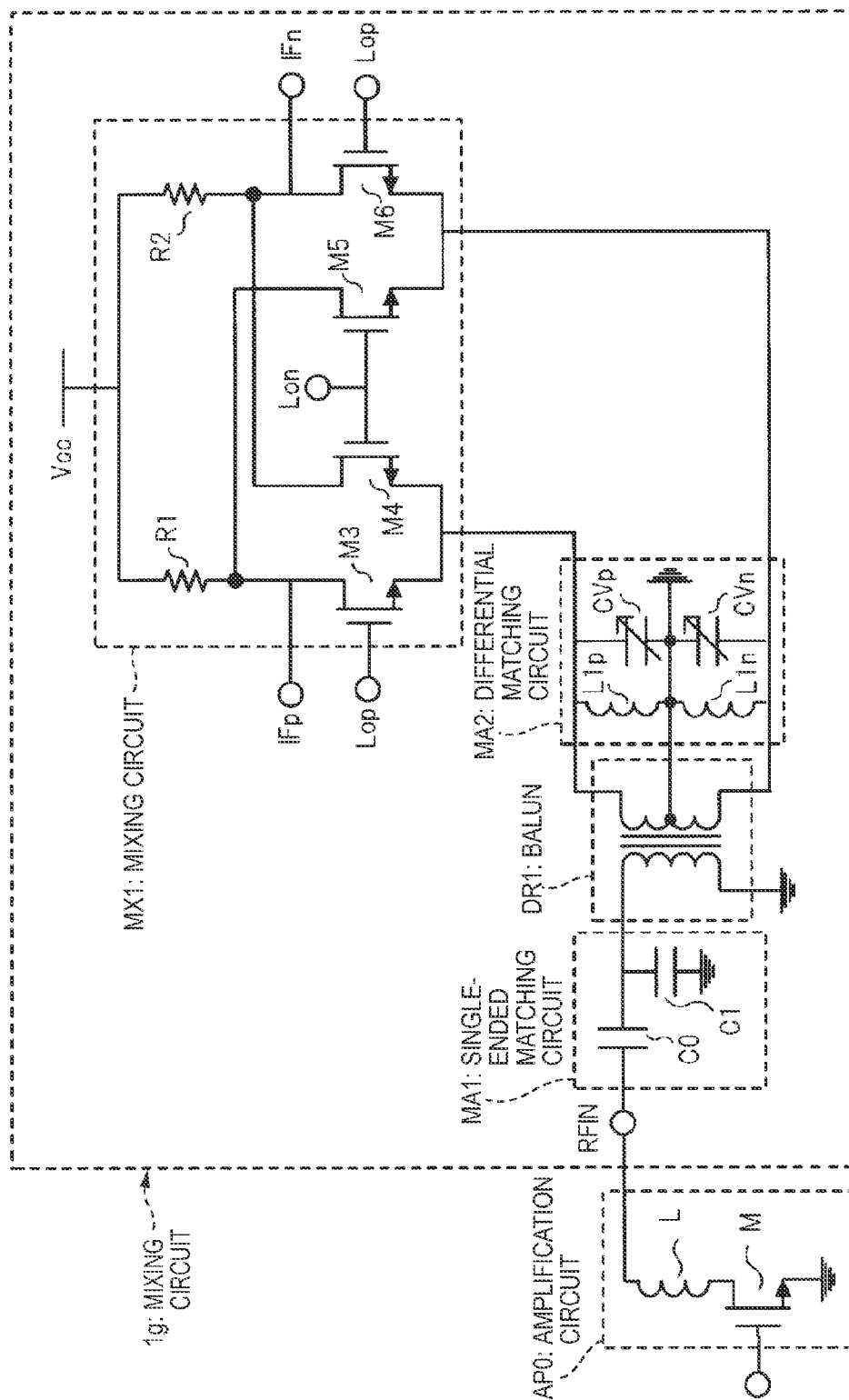
FIG. 14 shows the circuit configuration of a mixing circuit according to a sixth modification of the embodiment.

The mixing circuit 1 shown in FIG. 1 may be modified into a mixing circuit 1g in which the amplification circuit AP1 is moved to upstream of the single-ended matching circuit MA1 (see FIG. 14). FIG. 14 shows the circuit configuration of a mixing circuit 1g according to a sixth modification of the embodiment. Since an amplification circuit corresponding to the amplification circuit AP0 is provided upstream of the single-ended matching circuit MA1, the conversion gain of the mixing circuit 1g can be set lower in, for example, a reception circuit in which a radio-frequency signal is amplified in advance.

With the above configuration, in the mixing circuit 1g shown in FIG. 14, the amplification circuit AP1 as shown in FIG. 1 is omitted and output signals of the matching circuit MA2 which is composed of passive elements can directly be input to the mixing circuit MX1. In the mixing circuit 1g shown in FIG. 14, the circuit configuration can be made simpler than in the mixing circuit 1 shown in FIG. 1, reduction of the Q value due to the matching circuit MA2 can be suppressed, and the bandwidth can be set larger.

Embodiment 2

Figure 10:
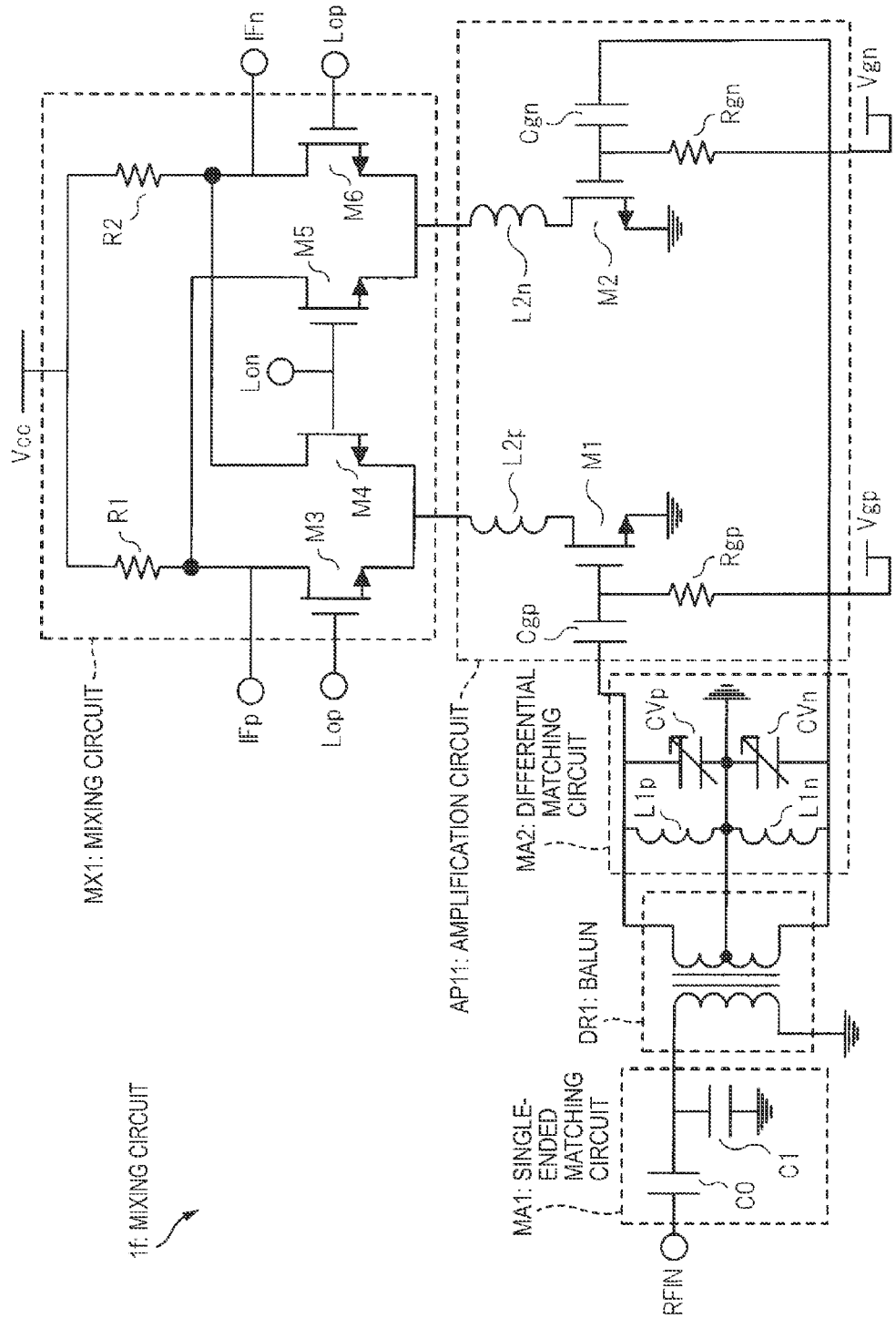
FIG. 10 shows the circuit configuration of a mixing circuit according to a second embodiment.
Figure 11:
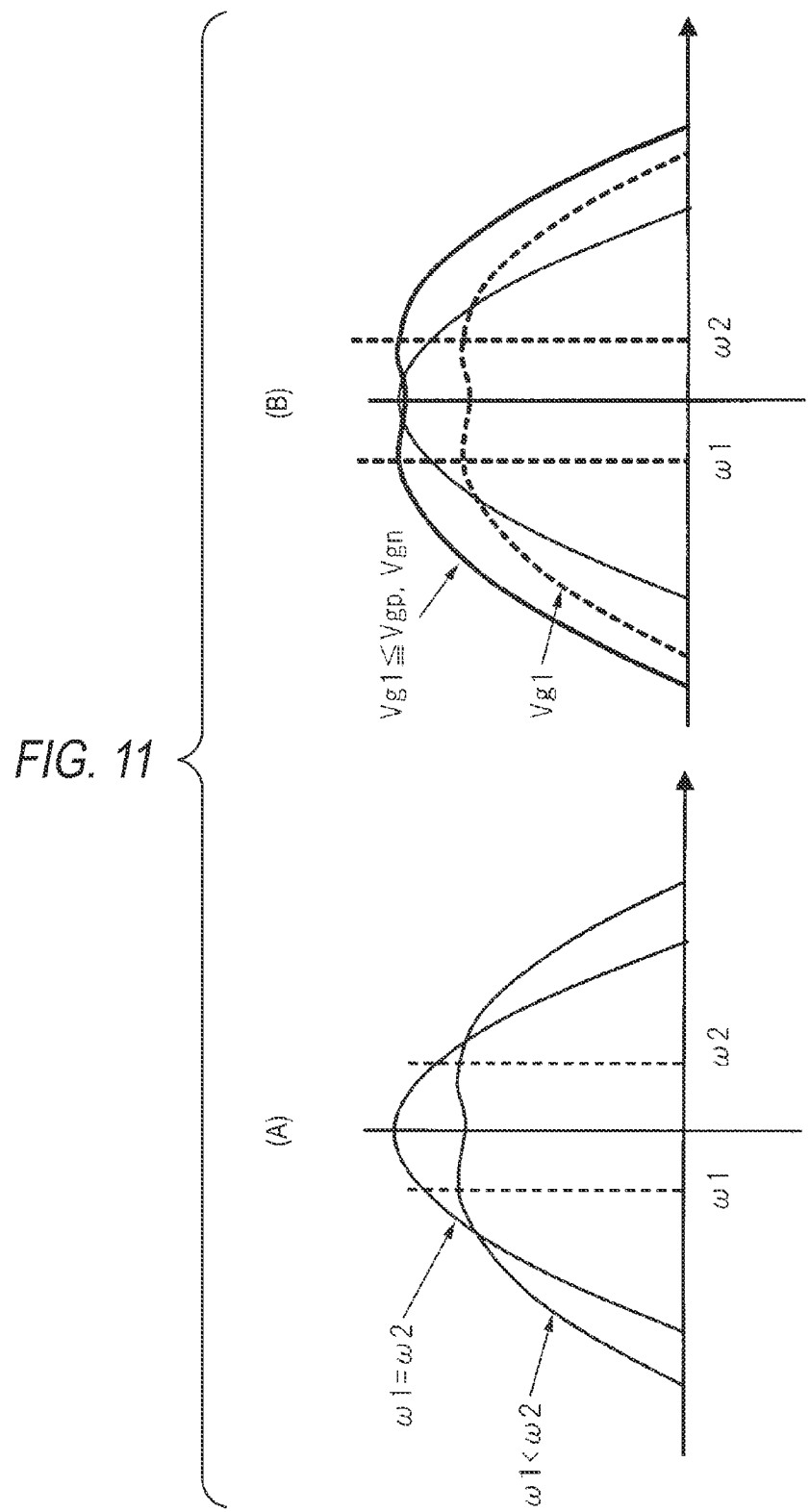
FIG. 11(A) illustrates a conversion gain profile in a case that gate bias currents are equal to a certain prescribed value.
FIG. 11(B) illustrates a conversion gain profile in a case that gate bias currents are larger than or equal to a prescribed value.

Next, a mixing circuit 1f according to a second embodiment will be described with reference to FIGS. 10 and 11. FIG. 10 shows the circuit configuration of the mixing circuit 1f according to the second embodiment. FIG. 11(A) shows a conversion gain profile in a case that gate bias currents are equal to a certain prescribed value. FIG. 11(B) shows a conversion gain profile in a case that gate bias currents are larger than or equal to a prescribed value. Circuit elements of the mixing circuit 1f shown in FIG. 10 that have the same ones in the mixing circuit 1 shown in FIG. 1 will not be illustrated or described or will be illustrated or described in simplified manners. The differences will be described below.

The method for shifting the resonance frequencies for obtaining a maximum-level positive-phase output signal and reverse-phase output signal as outputs of the differential matching circuit MA2 to different values ω1 and ω2 in the differential matching circuit MA2 which is the input load of the amplification circuit AP1, to decrease the frequency deviation of the conversion gain of the mixing circuit 1 has been described in the first embodiment. With this method, although the bandwidth of the mixing circuit 1 is increased because the conversion gains of a positive-phase output signal and a reverse-phase output signal are subjected to averaging, the maximum value of the conversion gain of the mixing circuit 1 becomes smaller than its maximum conversion gain in the case of ω1=ω2 (see FIG. 11(A)).

In this embodiment, to decrease the frequency deviation of the conversion gain of the mixing circuit 1f and to obtain a conversion gain that is approximately the same as the its maximum conversion gain in the case of ω1=ω2, the gate bias voltages of the amplification circuit AP1 are set higher than in the amplification circuits used in the above-described embodiment and modifications.

In the mixing circuit 1f shown in FIG. 10, a DC blocking capacitor Cgp is series-connected to the input end of a transistor M1 of an amplification circuit AP1f and a gate bias current corresponding to a gate bias voltage Vgp which is higher than or equal to a certain prescribed value flows into the gate of the transistor M1. The gate bias current is equal to (gate bias voltage Vgp)/(resistance Rgp).

And a DC blocking capacitor Cgn is series-connected to the input end of a transistor M2 and a gate bias current corresponding to a gate bias voltage Vgn which is higher than or equal to a certain prescribed value flows into the gate of the transistor M2. The gate bias current is equal to (gate bias voltage Vgn)/(resistance Rgn).

In the mixing circuit, impedance matching for obtaining a maximum-level positive-phase output signal and reverse-phase output signal in the differential matching circuit MA2 and, at the same time, the gate bias currents that flow into the gates of the amplification circuit AP1f are shifted to a value that is larger than a certain prescribed value.

The gain of an amplification circuit that amplifies differential signals is the sum of gains for a positive-phase signal and a reverse-phase signal. Therefore, in this embodiment, when the differential matching circuit MA2 shifts the resonance frequencies for a positive-phase output signal and a reverse-phase output signal to, for example, a low-frequency side resonance frequency $\omega 1$ and a high-frequency side resonance frequency $\omega 2$ ($\omega 1 < \omega 2$), respectively, the conversion gain bandwidth for a positive-phase output signal and a reverse-phase output signal is increased but the maximum value of the conversion gains for a positive-phase output signal and a reverse-phase output signal become lower than the maximum conversion gain in the case of $\omega 1 = \omega 2$.

In this embodiment, since the gate bias currents of the transistors M1 and M2 of the amplification circuit AP1f are larger than the prescribed value, the current consumptions of the M1 and M2 are increased and the conversion gain is also increased (see FIG. 11(B). For example, the prescribed value is the gate bias current of each transistor of the amplification circuit used in each of the above-described embodiment and modifications.

In the mixing circuit 1f according to this embodiment, as described above the resonance frequencies of the differential matching circuit MA2 are shifted and, at the same time, the gate bias currents of the transistors M1 and M2 of the amplification circuit AL1f are set larger than the prescribed value. Therefore, the maximum value of the conversion gain of the mixing circuit 1f can be held the same even when the resonance frequencies of the differential matching circuit MA2 are shifted.

In actuality, the conversion gains for a positive-phase output signal and a reverse-phase output signal in a case that the differential matching circuit MA2 serves for matching at different resonance frequencies $\omega 1$ and $\omega 2$ are not identical and have different frequency characteristics, that is, they have different maximum values. A proper countermeasure to be taken by the mixing circuit 1f is to adjust the conversion gains by switching the gate bias currents of the amplification circuit AP1f to different values between a positive-phase output signal and a reverse-phase output signal of the differential matching circuit MA2. As a result, in the mixing circuit 1f, the operation frequency bandwidth can be increased and the frequency deviation characteristic of the conversion gain can be improved.

In the mixing circuit 1f according to the second embodiment, as in the mixing circuit 1g shown in FIG. 14, the amplification circuit AP1f can be moved to upstream of the single-ended matching circuit MA1. Where an amplification circuit corresponding to the amplification circuit AP1f is provided upstream of the single-ended matching circuit MA1, the conversion gain of the mixing circuit 1g can be set lower in, for example, a reception circuit in which a radio-frequency signal is amplified in advance.

In this configuration, in the mixing circuit if according to the second embodiment, as in the mixing circuit 1g according to the sixth modification of the first embodiment, the amplification circuit AP1f as shown in FIG. 10 is omitted and output signals of the matching circuit MA2 which is composed of passive elements can directly be input to the mixing circuit MX1. In the mixing circuit in which the amplification circuit AP1f shown in FIG. 10 is moved to upstream of the single-ended matching circuit MA1, the circuit configuration can be made simpler than in the mixing circuit if shown in FIG. 10, reduction of the Q value due to the matching circuit MA2 can be suppressed, and the bandwidth can be set larger.

Although the various embodiments have been described above with reference to the drawings, it goes without saying that the disclosure is not limited to those examples. It is apparent that those skilled in the art would conceive various changes or modifications within the confines of the claims. And such changes or modifications should naturally be construed as being included in the technical scope of the disclosure.

The transistors used in each of the above embodiments and modifications may be either of the unipolar type or the bipolar type.

The present application is based on Japanese Patent Application No. 2013-043495 filed on Mar. 5, 2013, the disclosure of which is incorporated herein by reference.

INDUSTRIAL APPLICABILITY

The disclosure is useful to provide mixing circuits which are decreased in the frequency deviation of the conversion gain for an input radio-frequency signal in a wide band.

DESCRIPTION OF SYMBOLS 1, 1a, 1b, 1c, 1d, 1e, 1f: Mixing circuit
AP1: Amplification circuit
C1p: Capacitor
DR1: Balun
L1p: Inductor
MA1: Single-ended matching circuit
MA2, MA2a, MA2b, MA2c, MA2d: Differential matching circuit
MX1: Mixing circuit

The invention claimed is:
1. A mixing circuit comprising:
a balun that converts a single-ended radio-frequency signal into differential signals;
a differential matching circuit that
outputs a maximum-level positive-phase output signal of the balun at a low frequency lower than a center frequency of the radio-frequency signal and outputs a maximum-level reverse-phase output signal of the balun at a high frequency higher than the center frequency of the radio-frequency signal; or
outputs a maximum-level positive-phase output signal of the balun at a high frequency higher than the center frequency of the radio-frequency signal and outputs a maximum-level reverse-phase output signal of the balun at a low frequency lower than the center frequency of the radio-frequency signal;
an amplification circuit that amplifies a positive-phase output signal and a reverse-phase output signal of the differential matching circuit; and
a mixing circuit that converts the positive-phase output signal and the reverse-phase output signal of the amplification circuit into intermediate-frequency signals using locally generated signals.

2. The mixing circuit according to claim 1, wherein the differential matching circuit comprises:
a first inductor and at least one first variable capacitor which are connected to each other in parallel and are provided between a signal path of the positive-phase output signal of the balun and a ground; and
a second inductor and at least one second variable capacitor which are connected to each other in parallel and are provided between a signal path of the reverse-phase output signal of the balun and the ground.

3. The mixing circuit according to claim 1, wherein the differential matching circuit comprises:
a third inductor and plural series connections of a capacitor and a switch which are connected to each other in parallel and are provided between a signal path of the positive-phase output signal of the balun and a ground; and
a fourth inductor and plural series connections of a capacitor and a switch which are connected to each other in parallel and are provided between a signal path of the reverse-phase output signal of the balun and the ground.

4. The mixing circuit according to claim 1, wherein the differential matching circuit comprises:
plural capacitors which are connected to each other in series and are provided between signal paths of the positive-phase output signal and the reverse-phase output signal of the balun;
a pair of inductors provided between the signal paths of the positive-phase output signal and the reverse-phase output signal of the balun and a ground; and
switches for grounding respective connecting points of the capacitors.

5. The mixing circuit according to claim 1, wherein:
the balun is a transformer in which a grounded primary inductor and a series connection of plural secondary inductors provided between signal paths of the positive-phase output signal and the reverse-phase output signal are coupled to each other inductively;
the differential matching circuit comprises a pair of capacitors provided between the signal paths of the positive-phase output signal and the reverse-phase output signal of the balun and a ground; and
connecting points of the secondary inductors are to be grounded via respective switches.

6. The mixing circuit according to claim 1, further comprising an inductor circuit which is provided between the amplification circuit and the mixing circuit and comprises a first inductor which is series-connected to a signal path of the positive-phase output signal of the amplification circuit and a second inductor which is series-connected to a signal path of the reverse-phase output signal of the amplification circuit.

7. The mixing circuit according to claim 1, wherein:
the differential matching circuit comprises:
a first variable inductor or a first variable capacitor which adjusts frequency components of a positive-phase output signal; and
a second variable inductor or a second variable capacitor which adjusts frequency components of a reverse-phase output signal;
the amplification circuit comprises a first inductor which adjusts frequency components of a positive-phase output signal and a second inductor which adjusts frequency components of a reverse-phase output signal;
frequency components of the positive-phase output signal that is output from the amplification circuit are is adjusted using the first variable inductor or the first variable capacitor and the first inductor; and
frequency components of the reverse-phase output signal that is output from the amplification circuit are adjusted using the second variable inductor or the second variable capacitor and the second inductor.

8. The mixing circuit according to claim 1, wherein:
the amplification circuit comprises a first amplification element that amplifies the positive-phase output signal of the differential matching circuit and a second amplification element that amplifies the reverse-phase output signal of the differential matching circuit; and
the first and second amplification elements amplify the positive-phase output signal and the reverse-phase output signal of the differential matching circuit according to first and second gate bias voltages, respectively, which are supplied in synchronism with a control signal for switching the center frequency of the radio-frequency signal in the differential matching circuit.

9. A mixing circuit comprising:
a single-ended matching circuit that outputs a maximum-level single-ended radio-frequency signal at a center frequency of the radio-frequency signal;
a balun that converts the output single-ended signal of the single-ended matching circuit into differential signals;
a differential matching circuit that outputs a maximum-level positive-phase output signal of the balun at a frequency lower than or higher than the center frequency of the radio-frequency signal and outputs a maximum-level reverse-phase output signal at a frequency higher than or lower than the center frequency of the radio-frequency signal;
an amplification circuit that amplifies a positive-phase output signal and a reverse-phase output signal of the differential matching circuit; and
a mixing circuit that converts the positive-phase output signal and the reverse-phase output signal of the amplification circuit into intermediate-frequency signals using locally generated signals,
wherein the single-ended matching circuit comprises plural series connections of a capacitor and a switch which are provided between a signal path of the single-ended radio-frequency signal and a ground.

* * * * *